(12) United States Patent
Di Vincenzo et al.

(10) Patent No.: US 11,302,391 B2
(45) Date of Patent: Apr. 12, 2022

(54) SYSTEM AND METHOD FOR READING MEMORY CELLS

(71) Applicant: Micron Technology, Inc., Boise, ID (US)

(72) Inventors: Umberto Di Vincenzo, Capriate San Gervasio (IT); Riccardo Muzzetto, Arcore (IT); Ferdinando Bedeschi, Biassono (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/771,177

(22) PCT Filed: Dec. 3, 2019

(86) PCT No.: PCT/IB2019/001203
§ 371 (c)(1),
(2) Date: Jun. 9, 2020

(87) PCT Pub. No.: WO2021/111157
PCT Pub. Date: Jun. 10, 2021

(65) Prior Publication Data
US 2021/0217470 A1 Jul. 15, 2021

(51) Int. Cl.
*G11C 11/00* (2006.01)
*G11C 13/00* (2006.01)

(52) U.S. Cl.
CPC .......... *G11C 13/004* (2013.01); *G11C 13/003* (2013.01); *G11C 13/0004* (2013.01); *G11C 13/0069* (2013.01); *G11C 2013/0045* (2013.01)

(58) Field of Classification Search
CPC . G11C 13/004; G11C 13/0004; G11C 13/003; G11C 13/0069; G11C 2013/0045
See application file for complete search history.

(56) References Cited

U.S. PATENT DOCUMENTS 8,537,626 B2 * 9/2013 Fujisawa ................ G11C 7/109
365/194
9,799,381 B1 * 10/2017 Tortorelli ........... G11C 13/0069
(Continued)

FOREIGN PATENT DOCUMENTS

WO 2018063589 A1 4/2018

OTHER PUBLICATIONS

Taiwan Intellectual Property Office, "Office Action," issued in connection with ROC (Taiwan) Patent Application No. 109140265, dated Aug. 3, 2021 (7 pages).
(Continued)

*Primary Examiner* — Pho M Luu
(74) *Attorney, Agent, or Firm* — Holland & Hart LLP

(57) ABSTRACT

Methods, circuits, and systems for reading memory cells are described. The method may include: applying a first voltage with a first polarity to a plurality of the memory cells; applying a second voltage with a second polarity to one or more of said plurality of the memory cells; applying at least a third voltage with the first polarity to one or more of said plurality of the memory cells; detecting electrical responses of memory cells to the first voltage, the second voltage, and the third voltage; and determining a logic state of respective memory cells based on the electrical responses of the memory cells to the first voltage, the second voltage, and the third voltage.

32 Claims, 17 Drawing Sheets

(56) References Cited

U.S. PATENT DOCUMENTS

| | | |
|---|---|---|
| 2011/0182109 A1 | 7/2011 | Ikeda et al. |
| 2014/0269046 A1* | 9/2014 | Laurin ................ H01L 27/2445 365/163 |
| 2016/0111150 A1 | 4/2016 | Bazarsky et al. |
| 2018/0122468 A1 | 5/2018 | Pirovano et al. |
| 2018/0137908 A1 | 5/2018 | Wang et al. |

OTHER PUBLICATIONS

ISA/KR, International Search Report and Written Opinion of the International Searching Authority, Int'l Appl. No. PCT/IB2019/001203, Aug. 31, 2020, Korean Intellectual Property Office, Seo-gu, Daejeon, Republic of Korea, 12 pgs.

\* cited by examiner

| PROGRAMMING POLARITY 421 | <$V_{TH}$ (POS READ)> 422 | <$V_{TH}$ (NEG READ)> 424 |
|---|---|---|
| A POSITIVE B NEGATIVE ($V_A > V_B$) 426 | $V_{TH}$ Low1 | -$V_{TH}$ High1 |
| A NEGATIVE B POSITIVE ($V_A < V_B$) 428 | $V_{TH}$ High2 | -$V_{TH}$ Low2 |

FIG. 4B

| DIST | READ 1 | READ 2 | RESULT |
|------|--------|--------|--------|
| P1   | 1      |        | 1      |
| N    | 0      | 1      | 0      |
| P2   | 0      | 0      | 1      |

FIG. 6B

| Dist | READ 1 | READ 2 | READ 3 | RESULT |
|---|---|---|---|---|
| P1 | 1 | | | 1 |
| N1 | 0 | 1 | | 0 |
| P2 | 0 | 0 | 1 | 1 |
| N2 | 0 | 0 | 0 | 0 |

FIG. 7B

| DIST | READ 1 | READ 2 | READ 3 | READ 4 | READ ... | RESULT |
|------|--------|--------|--------|--------|----------|--------|
| P1   | 1      | 1      | 1      | 1      |          | 1      |
| N1   | 0      | 0      | 0      |        |          | 0      |
| P2   | 0      | 0      | 0      | 1      |          | 1      |
| N2   | 0      | 0      | 0      | 0      |          | 0      |
| P3   | 0      |        |        |        |          | 1      |
| ...  | ...    | ...    | ...    | ...    |          | ...    |
| etc  | ...    | ...    | ...    | ...    |          | ...    |

FIG. 8B

SYSTEM AND METHOD FOR READING MEMORY CELLS

CROSS REFERENCE

The present Application for Patent is a 371 national phase filing of and claims priority to and the benefit of International Patent Application No. PCT/IB2019/001203 to Di Vincenzo et al., titled "SYSTEM AND METHOD FOR READING MEMORY CELLS," filed Dec. 3, 2019, assigned to the assignee hereof, which is expressly incorporated herein by reference in its entirety.

FIELD OF TECHNOLOGY

The present disclosure relates to the field of electronics, and more specifically to a system and a method for reading memory cells.

BACKGROUND

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0". In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

Memory resources have innumerable applications in electronic devices and other computing environments. Continued drive to smaller and more energy efficient devices has resulted in scaling issues with traditional memory devices. Thus, there is a current demand for memory devices that can potentially scale smaller than traditional memory devices. However, some memory technologies that scale smaller than traditional devices can experience relatively high rates of errors. Computing systems typically implement error detection and correction mechanisms to handle errors and prevent system crashes, loss of information, or both. However, error correction mechanisms can increase system cost, occupy space on a die, and increase the amount of time for accurate retrieval of data from memory. Such drawbacks can be especially significant for larger or more complex error correcting systems used for memories with high error rates.

The present disclosure relates to improvements of memory read in order to reduce the error rate during reading memory cells.

BRIEF DESCRIPTION OF THE DRAWINGS

FIG. 4B is a table illustrating the effect of performing the single-polarity read illustrated in FIG. 4A in accordance with an embodiment of the present disclosure.

FIG. 6B is a chart illustrating results of the double-polarity read corresponding to FIG. 6A in accordance with an embodiment of the present disclosure.

FIG. 7B is a chart illustrating results of the double-polarity read corresponding to FIG. 7A in accordance with an embodiment of the present disclosure.

FIG. 8B is a chart illustrating results of the double-polarity read corresponding to FIG. 8A in accordance with an embodiment of the present disclosure.

DETAILED DESCRIPTION

Figure 1:
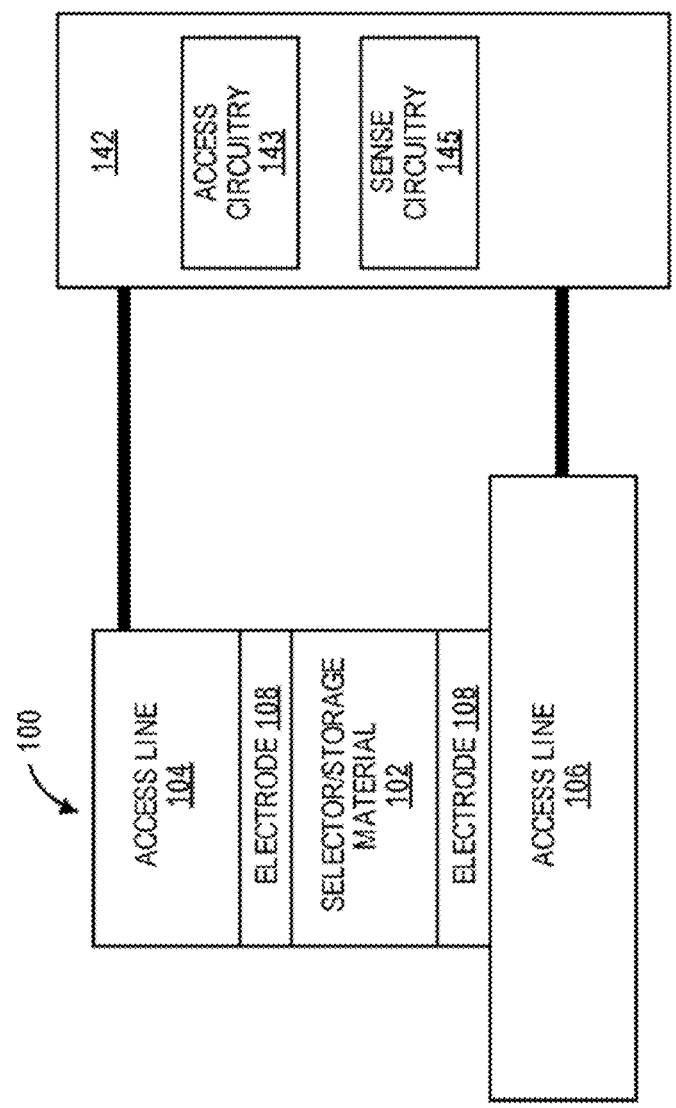
FIG. 1 is a diagram of a memory cell that can be read using a double-polarity read in accordance with an embodiment of the present disclosure.

The following description includes discussion of figures having illustrations given by way of example of implementations of embodiments of the disclosure. The drawings should be understood by way of example, and not by way of limitation. As used herein, references to one or more "embodiments" are to be understood as describing at least one implementation of the disclosure that includes one or more particular features, structures, or characteristics. Thus, phrases such as "in one embodiment" or "in an alternate embodiment" appearing herein describe various embodiments and implementations of the disclosure, and do not necessarily all refer to the same embodiment. However, they are also not necessarily mutually exclusive.

Double-polarity memory reads are described herein. In one embodiment, a memory cell array includes memory cells that can be programmed by applying voltage pulses to the cells. In one embodiment, writing information to memory cells involves applying voltage pulses with particular polarities to the memory cells. For example, programming a memory cell with a voltage pulse with one polarity results in the memory cell being in one logic state (e.g., a "logic 0"), and programming the memory cell with a voltage pulse with a different polarity results in the memory cell being in a different logic state (e.g., "logic 1"). Similarly, reading such memory cells can involve applying voltage pulses to the memory cells and detecting electrical responses from the memory cells.

One technique for reading such memory cells involves applying a voltage pulse with one particular polarity (e.g., a single-polarity read) to the memory cells. The electrical responses of the memory cells to the single-polarity read depend on the polarity of both the read and write voltage pulses. In some cases, the electrical responses of the memory cells programmed to logic 0 are sufficiently different from the electrical responses of the memory cells programmed to logic 1 to enable a single-polarity read to correctly determine the information stored in memory cells. However, in other cases, there can be significant overlap in the electrical responses of memory cells programmed with logic 0 and memory cells programmed with logic 1. In such cases where overlap exists, a single-polarity read may frequently output the incorrect value, resulting in a high error rate.

Unlike a single-polarity memory read, a double-polarity memory read involves a sequence of voltage pulses with different polarities, in accordance with embodiments. For example, in one embodiment, a double-polarity read involves first applying a pulse having a positive polarity relative to a reference voltage, and then applying a pulse with a negative polarity relative to the reference voltage. In one such embodiment, the double-polarity read involves determining the logic state of a given memory cell based on the memory cell's responses to the first and second voltage pulses. For example, based on the first voltage pulse, the logic state of some if not most of the logic 1 cells can be correctly ascertained. In one such example, after the first voltage pulse, the logic state of the remaining logic 1 cells as well as the logic 0 cells are considered indeterminate. A second voltage pulse applied to at least the indeterminate cells can resolve the indeterminacy. Accordingly, a double-polarity read sequence can enable accurate recovery of information from a memory cell that might otherwise output the incorrect value when read in accordance with conventional methods. In order to further reduce the error rate, the magnitude of the second voltage pulse may be reduced and a third or fourth voltage pulse may be applied to one or more of the memory cells.

FIG. 1 illustrates one example of a memory cell that can be read using a double-polarity reading technique, in accordance with an embodiment. In the embodiment illustrated in FIG. 1, the memory cell 100 includes a storage material 102 between access lines 104 and 106. The access lines 104, 106 electrically couple the memory cell 100 with circuitry 142 that writes to and reads the memory cell 100. The term "coupled" can refer to elements that are physically, electrically, and/or communicatively connected either directly or indirectly, and may be used interchangeably with the term "connected" herein. Physical coupling can include direct contact. Electrical coupling includes an interface or interconnection that allows electrical flow and/or signaling between components. Communicative coupling includes connections, including wired and wireless connections, that enable components to exchange data.

In one embodiment, the storage material 102 includes a self-selecting material that exhibits memory effects. A self-selecting material is a material that enables selection of a memory cell in an array without requiring a separate selector element. Thus, FIG. 1 illustrates the storage material 102 as a "selector/storage material." A material exhibits memory effects if circuitry for accessing memory cells can cause the material to be in one of multiple states (e.g., via a write operation), and later determine the programmed state (e.g., via a read operation). Circuitry for accessing memory cells (e.g., via read and write operations) is referred to generally as "access circuitry," and is discussed further below with reference to the access circuitry 143. Access circuitry can store information in the memory cell 100 by causing the storage material 102 to be in a particular state. The storage material 102 can include, for example, a chalcogenide material such as Te—Se alloys, As—Se alloys, Ge—Te alloys, As—Se—Te alloys, Ge—As—Se alloys, Te—As—Ge alloys, Si—Ge—As—Se alloys, Si—Te—As—Ge alloys, or other material capable of functioning as both a storage element and a selector, to enable addressing a specific memory cell and determining what the state of the memory cell is. Thus, in one embodiment, the memory cell 100 is a self-selecting memory cell that includes a single layer of material that acts as both a selector element to select the memory cell and a memory element to store a logic state.

In one embodiment, the storage material 102 is a phase change material. A phase change material can be electrically switched between a generally amorphous and a generally crystalline state across the entire spectrum between completely amorphous and completely crystalline states. In another embodiment, the storage material 102 is not a phase change material. In one embodiment in which the storage material 102 is not a phase change material, the storage material is capable of switching between two or more stable states without changing phase. In one such embodiment, the access circuitry 143 programs the memory cell 100 by applying a voltage with a particular polarity to cause the storage material 102 to be in the desired stable state.

In one such embodiment, programming the memory cell 100 causes the memory cell 100 to "threshold" or undergo a "threshold event." When a memory cell switches (e.g., during a program voltage pulse), the memory cell undergoes a physical change that causes the memory cell to exhibit a certain threshold voltage in response to the application of a subsequent voltage (e.g., a read voltage with a particular magnitude and polarity). Programming the memory cell 100 can therefore involve applying a voltage of a given polarity to induce a programming threshold event, which causes the memory cell 100 to exhibit a particular threshold voltage at a subsequent read voltage of a same or different polarity. In one such embodiment, the storage material 102 is a self-selecting material (e.g., a non-phase change chalcogenide material or other self-selecting material) that can be programmed by inducing a threshold event.

As is explained in further detail below, in one embodiment, the output of such a memory cell when read differs as a function of the polarity used to program the memory cell and the polarity used to read the memory cell. For example, in one embodiment, the storage material 102 exhibits a "lower threshold voltage" or a "higher threshold voltage" in response to a read voltage pulse based on the polarity of both the programming and read voltages. In one embodiment, exhibiting a threshold voltage means that there is a voltage across the memory cell that is approximately equal to the threshold voltage in response to the application of a voltage with a particular magnitude and polarity to the terminals of the memory cell.

As mentioned above, the access lines 104, 106 electrically couple the memory cell 100 with circuitry 142. The access lines 104, 106 can be referred to as a bitline and wordline, respectively. The wordline is for accessing a particular word in a memory array and the bitline is for accessing a particular bit in the word. The access lines 104, 106 can be composed of one or more metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material.

In one embodiment, electrodes 108 are disposed between storage material 102 and access lines 104, 106. Electrodes 108 electrically couple access lines 104, 106 with storage material 102. Electrodes 108 can be composed of one or more conductive and/or semiconductive materials such as, for example: carbon (C), carbon nitride ($C_xN_y$); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including $RuO_2$, or other suitable conductive materials. In one embodiment, conductive wordline layer can include any suitable metal including, for example, metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN, or another suitable electrically conductive material.

Referring again to the circuitry 142, the access lines 104, 106 communicatively couple the circuitry 142 to the memory cell 100, in accordance with an embodiment. The circuitry 142 includes access circuitry 143 and sense circuitry 145, in accordance with an embodiment. Circuitry includes electronic components that are electrically coupled to perform analog or logic operations on received or stored information, output information, and/or store information. Hardware logic is circuitry to perform logic operations such as logic operations involved in data processing. In one embodiment, the access circuitry 143 applies voltage pulses to the access lines 104, 106 to write to or read the memory cell 100. The terms "write" and "program" are used interchangeably to describe the act of storing information in a memory cell. In one embodiment, to write to the memory cell 100, the access circuitry applies a voltage pulse with a particular magnitude and polarity to the access lines 104, 106, which can both select memory cell 100 and program memory cell 100.

In one embodiment, the access circuitry 143 applies a pulse with one polarity to program the memory cell 100 to be in one logic state, and applies a pulse with a different polarity to program the memory cell 100 to be in a different logic state. The access circuitry 143 can then differentiate between different logic states as a consequence of the programming polarity of a memory cell. For example, in a case of a memory read, in one embodiment, the access circuitry 143 applies a voltage pulse with a particular magnitude and polarity to the access lines 104, 106, which results in an electrical response that the sense circuitry 145 can detect. Detecting electrical responses can include, for example, detecting one or more of: a voltage drop (e.g., a threshold voltage) across terminals of a given memory cell of the array, current through the given memory cell, and a threshold event of the given memory cell. In some cases, detecting a threshold voltage for a memory cell can include determining that the cell's threshold voltage is lower than or higher than a reference voltage, for example a read voltage. The access circuitry 143 can determine the logic state of the memory cell 100 based on electrical responses to one or more of the voltage pulses in the read sequence. The memory cell 100 is one example of a memory cell that can be read with a double-polarity read. Other embodiments can include memory cells having additional or different layers of material than illustrated in FIG. 1 (e.g., a thin dielectric material between the storage material and access lines).

Figure 2:
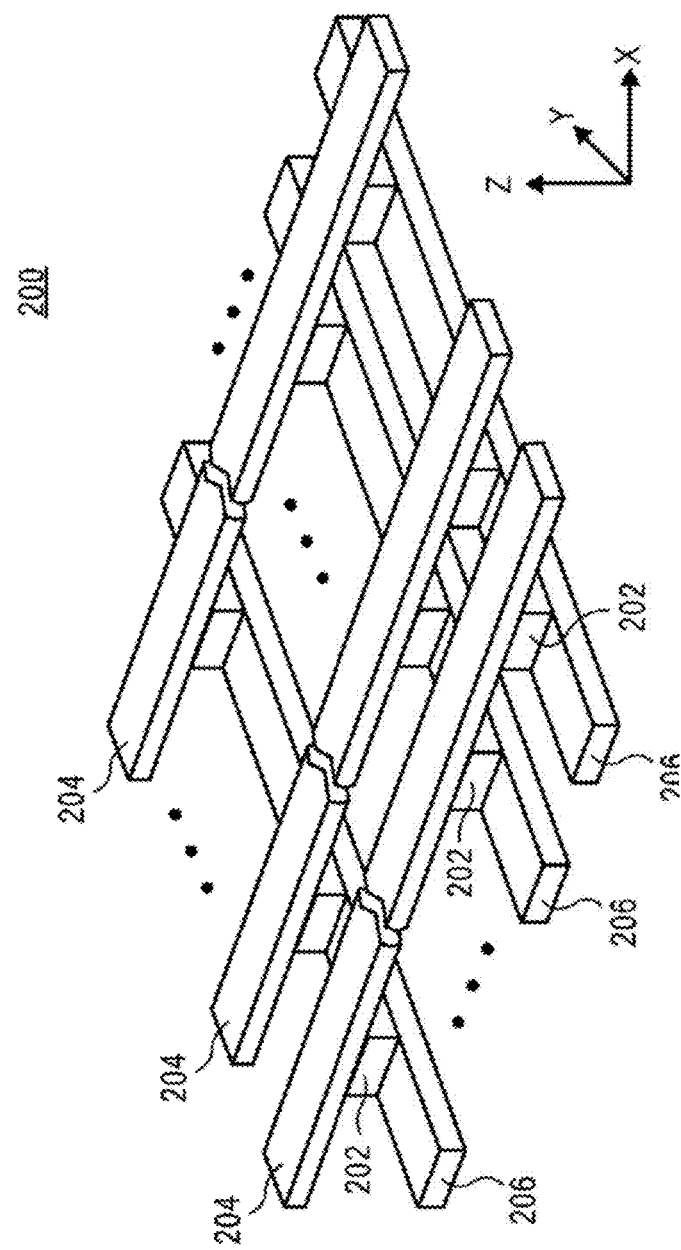
FIG. 2 illustrates a portion of a memory cell array in accordance with an embodiment of the present disclosure.

FIG. 2 illustrates a portion of a memory cell array 200, which can include a memory cell such as the memory cell 100 of FIG. 1, in accordance with an embodiment. Memory cell array 200 is an example of a three dimensional (3D) cross-point memory structure. The memory cell array 200 includes a plurality of access lines 204, 206, which can be the same or similar as the access lines 104, 106 described with respect to FIG. 1. Access lines 204, 206 can be referred to as bitlines and wordlines. In the embodiment illustrated in FIG. 2, the bitlines (e.g., access lines 204) are orthogonal to the wordlines (e.g., access lines 206). A storage material 202 (such as the storage material 102 of FIG. 1) is disposed between the access lines 204, 206. In one embodiment, a "cross-point" is formed at an intersection between a bitline, a wordline. A memory cell is created from the storage material 202 between the bitline and wordline where the bitline and wordline intersect. The storage material 202 can be a chalcogenide material such as the storage material 102 described above with respect to FIG. 1. In one embodiment, the access lines 204, 206 are composed of one or more conductive materials such as the access lines 104, 106 described above with respect to FIG. 1. Although a single level or layer of memory cells is shown in FIG. 2, memory cell array 200 can include multiple levels or layers of memory cells (e.g., in the z-direction). FIGS. 1 and 2 illustrate an example of a memory cell and array in which double-polarity reads can be implemented. However, double-polarity reads can be implemented in other memory cell structures and arrays in which the memory cells exhibit electrical responses that vary as a function of programming and read polarity.

Figure 3A:
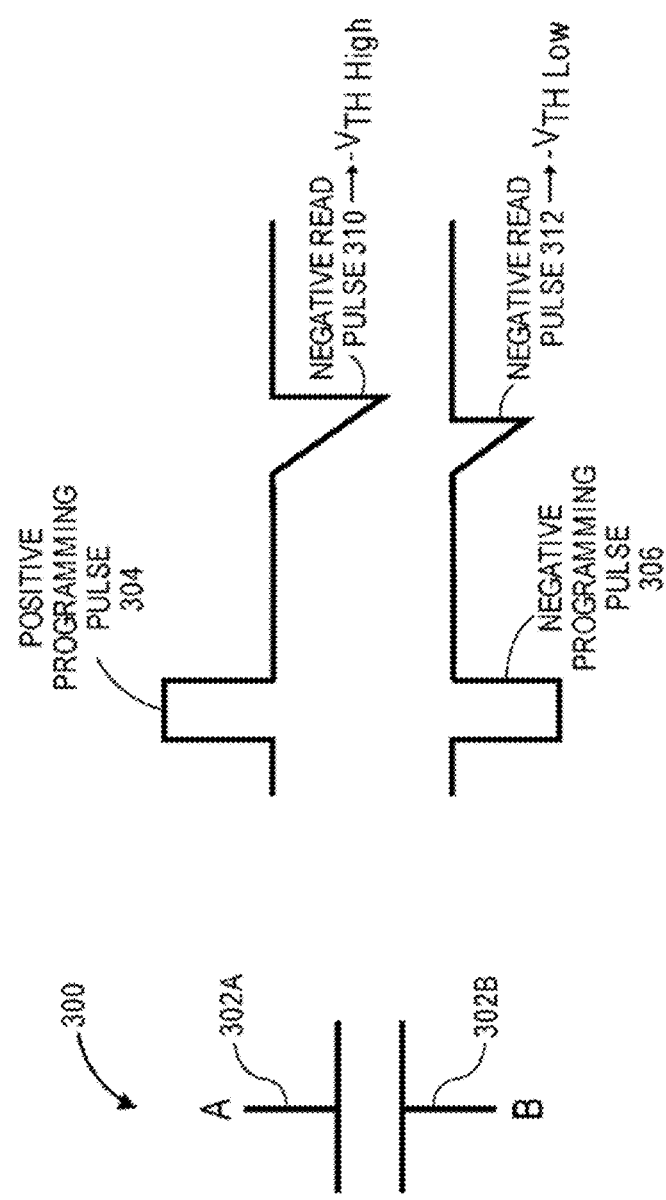
FIG. 3A is a diagram illustrating a single-polarity read of a memory cell in accordance with an embodiment of the present disclosure.
Figure 3B:
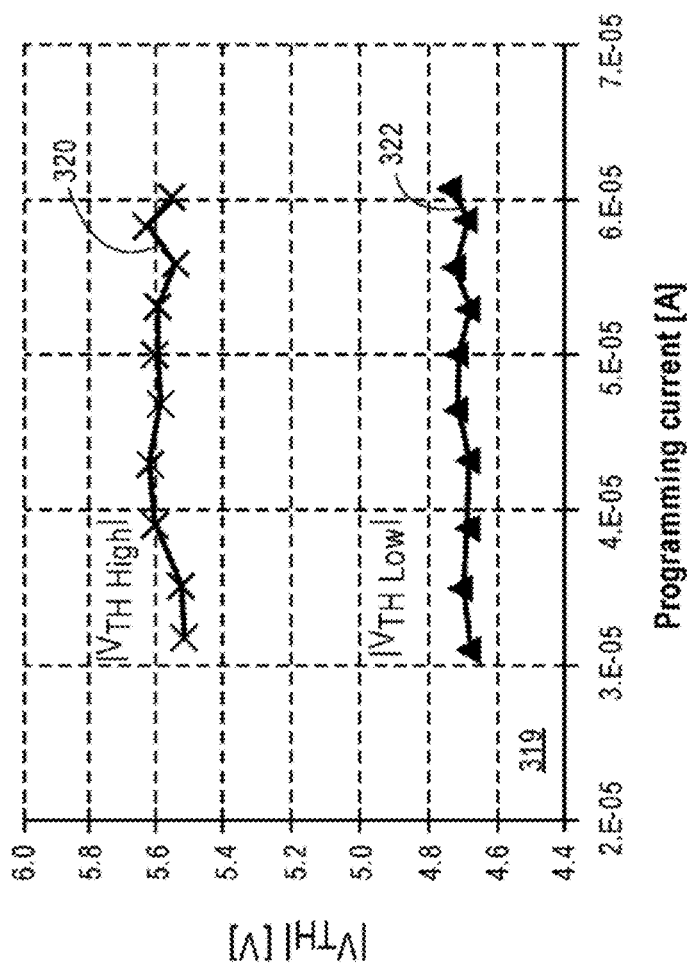
FIG. 3B is a graph of experimental data showing lower and higher threshold voltages exhibited by a memory cell in accordance with an embodiment of the present disclosure.

FIGS. 3A and 3B illustrate how the polarity of programming and read voltage pulses can affect the threshold voltage exhibited by a memory cell such as the memory cell 100 of FIG. 1, in accordance with embodiments. FIG. 3A is a diagram illustrating a single-polarity read of a memory cell, in accordance with an embodiment. FIG. 3B is a graph illustrating threshold voltages with lower and higher magnitudes, in accordance with an embodiment.

Referring to FIG. 3A, a memory cell 300 has terminals 302A, 302B (labeled A and B, respectively) for accessing the memory cell 300. In one embodiment, terminals A and B are access lines, such as the access lines 104 and 106 of FIG. 1 or access lines 204 and 206 of FIG. 2. Access circuitry (such as the access circuitry 143 referred to in FIG. 1) can write to or read the memory cell 300 by applying a voltage having a particular magnitude and polarity to the terminals 302A, 302B of the memory cell, in accordance with embodiments. For example, FIG. 3A shows a "positive" programming pulse 304 and a "negative" programming pulse 306. A positive programming pulse refers to a programming pulse with "positive polarity," which can also be referred to as "forward polarity." A negative programming pulse is a voltage pulse with "negative polarity," which can also be referred to as "reverse polarity." In one embodiment, whether or not a programming pulse is positive or negative is based on the relative voltages applied to the terminals 302A, 302B. A voltage pulse can be defined as positive if the voltage applied to one of the terminals is more positive than the voltage applied to a second of the terminals. For example, referring to FIG. 3A, a positive voltage pulse can include: a positive voltage applied to terminal 302A and a negative voltage applied to terminal 302B; a positive voltage applied to terminal 302A and 0 V (e.g., circuit ground or neutral reference) applied to terminal 302B; 0V applied to terminal 302A and a negative voltage applied to terminal 302B, a positive voltage applied to both terminals 302A and 302B, but where the voltage applied to 302A is greater than the voltage applied to 302B; or a negative voltage applied to both terminals 302A and 302B, but where the voltage applied to 302A is greater than the voltage applied to 302B.

In such an embodiment, a voltage pulse applied to the terminals of the memory cell would be negative if the voltage applied to terminal 302A is more negative than the voltage applied to terminal 302B. For example, a negative voltage pulse can include: a negative voltage applied to terminal 302A and a positive voltage applied to terminal 302B; a negative voltage applied to terminal 302A and 0 V (e.g., circuit ground or neutral reference) applied to terminal 302B; 0V applied to terminal 302A and a positive voltage applied to terminal 302B, a negative voltage applied to both terminals 302A and 302B, but where the magnitude of the voltage applied to 302A is greater than the magnitude of the voltage applied to 302B; or a positive voltage applied to both terminals 302A and 302B, but where the magnitude of the voltage applied to 302B is greater than the magnitude of the voltage applied to 302A.

FIG. 3A shows a particular definition of "positive" and "negative" relative to terminals 302A, 302B for illustrative purposes, however, embodiments can define positive and negative differently. For example, an embodiment can define a positive programming pulse to be a voltage pulse in which the voltage applied to terminal 302B is more positive than the voltage applied to terminal 302A.

As mentioned above, in one embodiment, access circuitry can both write to and read a memory cell by applying a voltage with a particular magnitude and polarity to the cell. In one embodiment, access circuitry can write different values or logic states to the memory cell by applying voltages with different polarities. For example, the access circuitry can apply a positive programming pulse (e.g., positive programming pulse 304) to write one logic state, and a negative programming pulse (e.g., negative programming pulse 306) to write a different logic state. For ease of reference, the following description refers to a positive programming pulse as writing a "logic 1" to memory cell and a negative programming pulse as writing a "logic 0" to a memory cell, although a different convention can be adopted. For example, in one embodiment, access circuitry can apply a negative programming pulse to write a logic 1 and a positive programming pulse to write a logic 0.

In one embodiment, whether or not a voltage applied to a memory cell programs the cell depends upon the magnitude and duration of the applied voltage. For example, in one embodiment, access circuitry applies a programming pulse, such as the programming pulse 304 or 306, with a magnitude sufficient to cause the memory cell to threshold. For example, in one embodiment, the access circuitry can apply a voltage with a magnitude that is greater than or equal to the highest expected threshold voltage exhibited by the memory cell. In some embodiments the duration of a programming voltage pulse is 10 ns-50 ns. In some embodiments, the duration of the programming voltage pulse is 1-100 ns. In some embodiments, the duration of the programming voltage pulse is 1 ns-1 µs. In one embodiment, the duration of programming pulses and read pulses is the same.

Different embodiments can involve applying read and write voltage pulses of different shapes. In the embodiment illustrated in FIG. 3A, the programming pulses 304 and 306 are shown as box-shaped pulses (also known as rectangular-shaped or square-shaped pulses), and the read pulses 310, 312 are shown as ramped pulses. In one embodiment, the read pulses 310, 312 ramp up or down to a read voltage magnitude (e.g., to $-V_{TH\ High}$ and $-V_{TH\ Low}$ in the embodiment illustrated in FIG. 3A). In actual implementations, the voltage pulses may have leading or trailing edges, in accordance with embodiments. Other embodiments can apply write and read pulses having shapes such as triangular (e.g., ramped pulses), trapezoidal, rectangular, box, and/or sinusoidal shapes. Thus, circuitry for accessing memory cells can apply programming pulses having a variety of shapes and durations sufficient to cause the memory cells to threshold into the desired state.

One method of reading memory cells involves applying a voltage pulse to the memory cell with a single polarity. For example, FIG. 3A shows an example of a single-polarity read. In one such embodiment, access circuitry applies a voltage pulse with only a single particular polarity to the memory cells. Sense circuitry can detect the electrical response of a given memory cell to the single-polarity pulse. In the example illustrated in FIG. 3A, reading the memory cell 300 involves applying a negative voltage pulse, such as negative read pulses 310 and 312. Although FIG. 3A illustrates negative read pulses 310, 312, access circuitry can also perform a single-polarity read using only positive voltage pulses to perform a single-polarity read.

In one embodiment, if the read voltage pulse has a different polarity than the programming pulse, such as in the case of positive programming pulse 304 and negative read pulse 310, the memory cell exhibits a threshold voltage with a higher magnitude ($-V_{TH\ High}$). In one such embodiment, if the read voltage pulse has the same polarity as the programming pulse, the memory cell exhibits a threshold voltage with a lower magnitude ($-V_{TH\ Low}$). In the embodiment illustrated in FIG. 3A, the polarity of the resulting threshold voltage is negative because the read voltage pulses are negative. Thus, in accordance with an embodiment, when performing single polarity reads, the memory cell exhibits a threshold voltage with a higher magnitude (e.g., $|-V_{TH\ High}|$) when the memory cell is in one logic state, and a threshold voltage with a lower magnitude ($|-V_{TH\ Low}|$) when the memory cell is in another logic state. Access circuitry can thus determine the logic state of a given cell based on whether the memory cell exhibits a higher or lower magnitude threshold voltage.

FIG. 3B is a graph 319 showing threshold voltages with a higher and lower magnitude, in accordance with an embodiment. The graph 319 includes experimental data (threshold voltages) collected from memory cells in response to application of different programming currents.

Thus, the x-axis of the graph 319 is the magnitude (absolute value) of the programming current and the y-axis of the graph 319 is the magnitude (absolute value) of the resulting threshold voltage in response to the programming current. As mentioned above, depending upon the programming and read polarities, the threshold voltage magnitude exhibited by a memory cell will be higher (e.g., $V_{TH\ High}$) or lower (e.g., $V_{TH\ Low}$). The graph 319 in FIG. 3B shows that the memory cells exhibit the higher and lower threshold voltages for a range of programming currents. The graph 319 also shows that the higher and lower threshold voltages are actually ranges of voltages. For example, the higher threshold voltage magnitudes 320 are a range of magnitudes clustered at approximately 5.6V in the illustrated example. Similarly, the lower threshold voltage magnitudes 322 are a lower range of magnitudes approximately centered around 4.7V in the illustrated example. The ranges of lower and higher threshold voltage magnitudes are separated by a window.

As is described in greater detail below with respect to FIG. 4C, the window between the ranges of threshold voltage magnitudes can affect the ability to reliably write to and read the memory cells. According to one embodiment, if the window between the threshold voltage ranges is sufficiently large (e.g., if the ranges of threshold voltages are sufficiently spaced apart), then access circuitry may be able to reliably distinguish between a logic 1 and 0 in response to a single-polarity read. For example, if the threshold voltage ranges are sufficiently spaced apart, access circuitry may be able to accurately read the memory cell by applying a single read voltage approximately at a mid-point between the low and high threshold voltages (e.g., about 5.1V in the example illustrated in FIG. 3B). In one such example, applying a single read voltage at the mid-point between the low and high threshold voltages would cause memory cells programmed with the negative programming pulse 306 to threshold, but not the memory cells programmed with the positive programming pulse 304. Accordingly, access circuitry could distinguish the logic state of the memory cells by determining which memory cells thresholded in response to the single read voltage. However, if the window between the threshold voltage ranges is small, or if the threshold voltage ranges overlap, it can be difficult to reliably distinguish between a logic 1 or 0 with a single-polarity read.

Figure 4A:
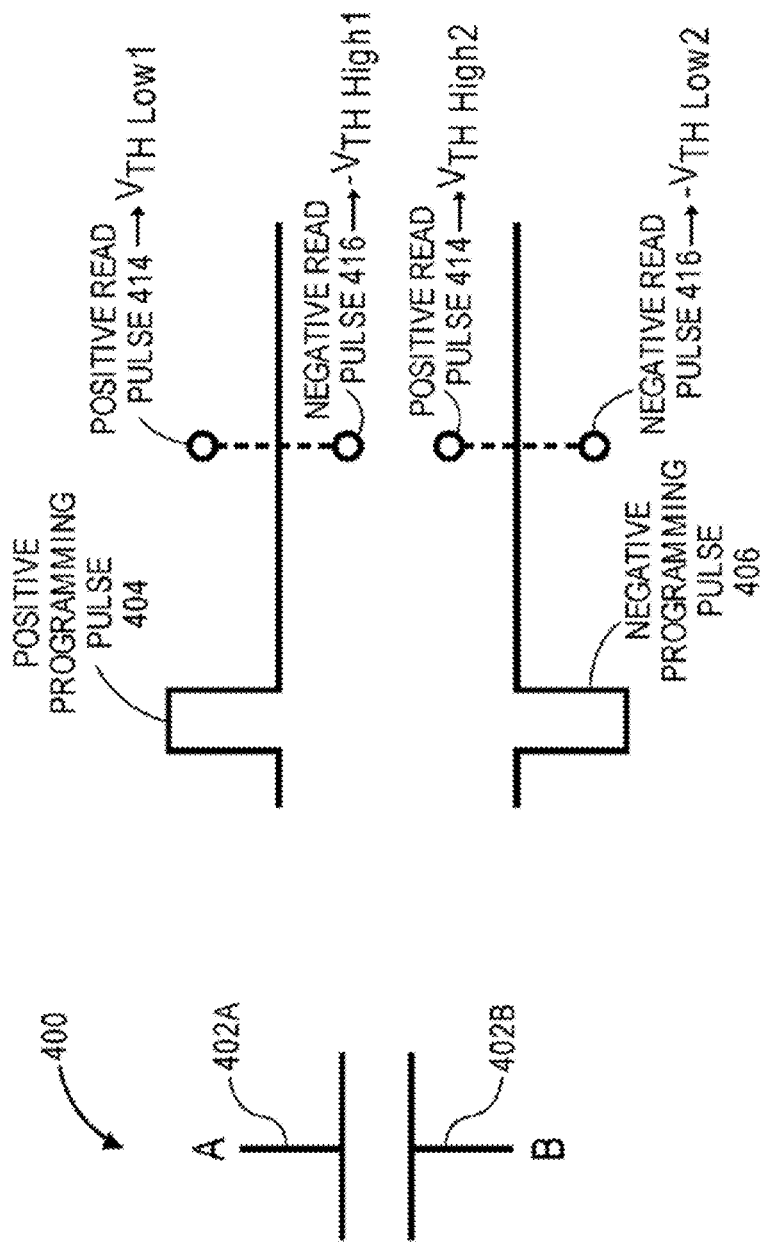
FIG. 4A is a diagram illustrating the effect of performing a single-polarity read with different polarities in accordance with an embodiment of the present disclosure.

FIGS. 4A and 4B illustrate the effect of single-polarity reads with different polarities. FIG. 4A is a diagram illustrating a single-polarity read with either a positive or negative voltage, in accordance with an embodiment. Similar to FIG. 3A, FIG. 4A shows a memory cell 400 with two terminals 402A, 402B. Also similar to FIG. 3A, FIG. 4A illustrates a positive programming pulse 404 and a negative programming pulse 406. FIG. 4A differs from FIG. 3A in that it shows the effects of positive and negative reads following positive and negative programming pulses, in accordance with an embodiment. Specifically, FIG. 4A shows positive read pulses 414 and negative read pulses 416. Note that although the read pulses 414, 416 are illustrated without a specific pulse shape, the pulses can be any suitable pulse shape, such as the pulse shapes discussed above with respect to FIG. 3A. Also note that FIG. 3A and the following description are regarding a single-polarity pulse (either positive read pulses or negative read pulses, but not both positive and negative pulses for a given read).

In one embodiment, when the applied voltage and the programming voltage have the same polarity, the magnitude of the threshold voltage is low. For example, in the embodiment illustrated in FIG. 4A, the positive programming pulse 404 followed by the positive read pulse 414 results in $V_{TH\ Low1}$. Similarly, the negative programming pulse 406 followed by the negative read pulse 416 results in $-V_{TH\ Low2}$. In one embodiment, when the applied voltage and the programming voltage have different polarities, the magnitude of the threshold voltage is high. For example, in the embodiment illustrated in FIG. 4A, the positive programming pulse 404 followed by the negative read pulse 416 results in $-V_{TH\ High1}$. The negative programming pulse 406 followed by positive read pulse 414 results in $V_{TH\ High2}$.

According to an embodiment, the magnitudes of higher and lower threshold voltages can vary. For example, in the embodiment illustrated in FIG. 4A, $V_{TH\ High1}$ can be different than $V_{TH\ High2}$. For example, in one embodiment, memory cells exhibit different high threshold voltage magnitudes that differ based on the polarity of the programming and read pulses. Specifically, the higher threshold voltage magnitude exhibited by a given memory cell when read with a negative voltage (e.g., the negative read pulse 416) is not necessarily the same as a higher threshold voltage magnitude exhibited by the cell when read with a positive voltage (e.g., the positive read pulse 414). Similarly, in one embodiment, memory cells exhibit different lower threshold voltage magnitudes that differ based on the polarity of the programming and read pulses. Specifically, the lower threshold voltage magnitude exhibited by a given memory cell when read with a positive voltage (e.g., the positive read pulse 414) is not necessarily the same as a lower threshold voltage magnitude exhibited by the cell when read with a negative voltage (e.g., the negative read pulse 416).

In another embodiment, the high threshold voltage magnitudes are substantially the same regardless of the polarity of the programming and read pulses. Similarly, in one embodiment, the low threshold voltage magnitudes are substantially the same regardless of the polarity of the programming and read pulses. As is discussed below, high and low threshold voltage magnitudes can also vary from memory cell to memory cell when read with the same polarity. For example, memory cells located at different locations on a wafer can have different low and high threshold voltages. Thus, according to embodiments, variations can exist in the magnitude of higher or lower threshold voltages due to, for example, read polarity and memory cell variations. In one embodiment, regardless of variations in high and low threshold voltages (e.g., due to programming/read polarity or memory cell variations), a given memory cell exhibits a high threshold voltage and a low threshold voltage, where the magnitude of the high threshold voltage is greater than the magnitude of the low threshold voltage.

FIG. 4B is a table illustrating outcomes of the single polarity reads illustrated in FIG. 4A, in accordance with an embodiment. The table of FIG. 4B shows how, in accordance with the embodiment illustrated in FIG. 4A, the read output from a memory cell is a function of the read and write polarities. Column 421 is the programming polarity applied to the terminals 402A, 402B of the memory cell 500. In the table of FIG. 4B, $V_A$ refers to the voltage applied to terminal A (402A) and $V_B$ refers to the voltage applied to terminal B (402B). Thus, row 426 shows a case in which the programming polarity relative to terminal 402A is positive ($V_A > V_B$). Row 428 shows a case in which the programming polarity relative to terminal 402A is negative ($V_B > V_A$).

Column 422 shows the threshold voltage when the polarity of the read voltage pulse is positive, and column 424 shows the threshold voltage when the polarity of the read voltage pulse is negative, in accordance with an embodiment. As explained above, when the polarity of the programming and read pulses is the same, the magnitude of the output voltage is low (e.g., $|V_{TH\ Low1}|$ or $|-V_{TH\ Low2}|$), in accordance with an embodiment. When the polarity of the programming and read pulses is different, the magnitude of the output voltage is high (e.g., $|-V_{TH\ High1}|$ or $|V_{TH\ High2}|$), in accordance with an embodiment. For example, in one embodiment where the higher threshold voltage has a magnitude of 5.7V and the lower threshold voltage has a magnitude of 4.7V, a positive programming pulse followed by a positive read pulse results in a threshold voltage of 4.7V. A positive programming pulse followed by a negative read pulse results in −5.7V. A negative programming pulse followed by a positive read pulse results in a threshold voltage of 5.7V. A negative programming pulse followed by a negative read pulse results in a threshold voltage of −4.7V. Thus, the magnitude and the sign of the output of a read depends upon the polarity of the programming voltage and the polarity of the read voltage, in accordance with an embodiment.

Figure 4C:
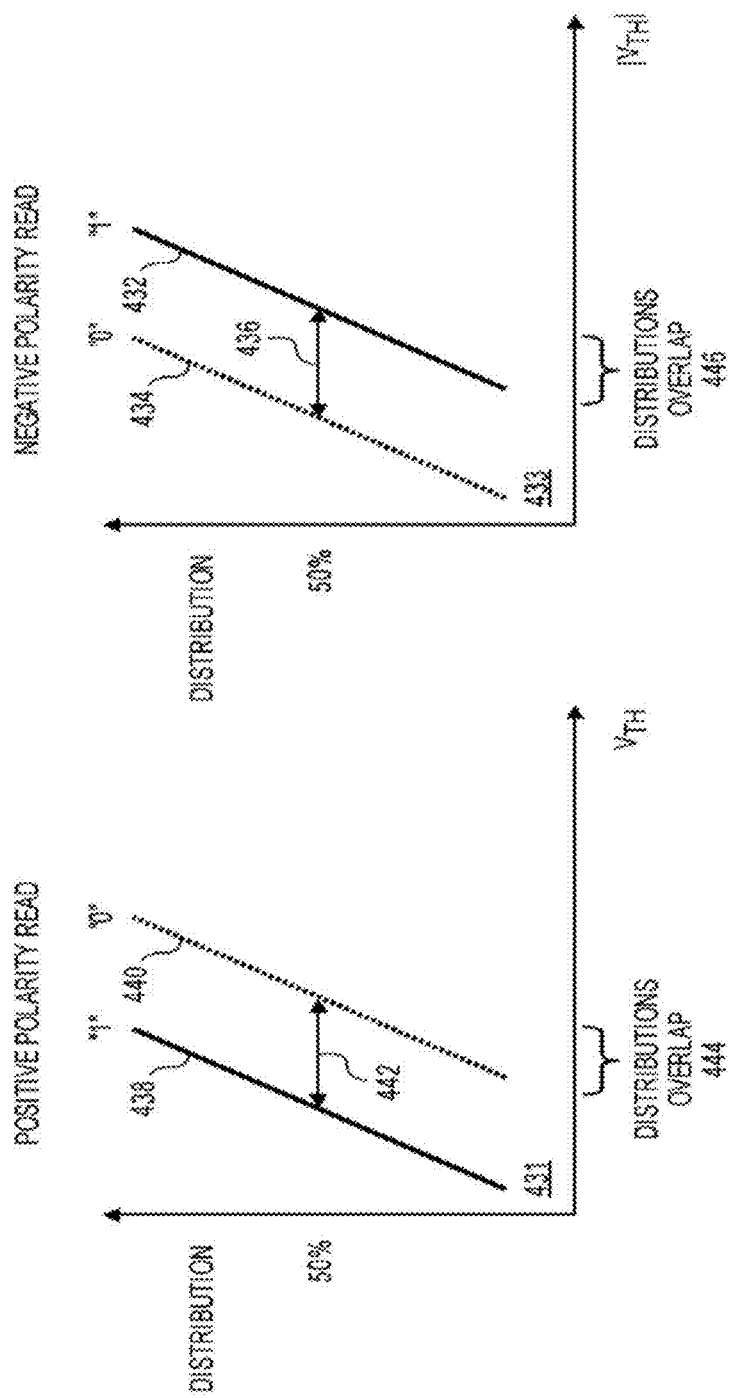
FIG. 4C illustrates graphs showing distributions of threshold voltages exhibited by a plurality of memory cells in accordance with an embodiment of the present disclosure.

FIG. 4C includes graphs that show the ranges of threshold voltage magnitudes as distributions, in accordance with an embodiment. The graph 431 illustrates the distribution of threshold voltage magnitudes in response to a positive polarity read, in accordance with an embodiment. The graph 433 illustrates the distribution of threshold voltage magnitudes in response to a negative polarity read, in accordance with an embodiment. In the embodiment illustrated in FIG. 4C, the distributions of threshold voltage magnitudes (|VTH|) are normal (e.g., Gaussian). For illustrative purposes, FIG. 4C adopts a particular programming convention that assumes access circuitry applies a positive programming pulse to program a cell to a logic 1, and a negative programming pulse to program the cell to a logic 0. However, another embodiment can adopt the opposite programming convention (e.g., a positive programming pulse can result in a logic 0 and a negative programming pulse can result in a logic 1).

Referring to the graph 431, the line 438 shows a distribution of threshold voltage magnitudes exhibited by memory cells programmed with a logic 1 when read with a positive voltage pulse. Thus, under the programming convention illustrated in FIG. 4C, the line 438 shows a distribution of threshold voltage magnitudes exhibited by a memory cell that is programmed and read with voltage pulses having the same polarity. The line 438 therefore illustrates a distribution of lower threshold voltage magnitudes. The line 440 shows a distribution of threshold voltage magnitudes exhibited by memory cells programmed with a logic 0 and read with a positive voltage pulse. Thus, under the programming convention illustrated in FIG. 4C, the line 440 shows a distribution of threshold voltage magnitudes exhibited by a memory cell that is programmed and read with voltage pulses having different polarities (e.g., programmed with a negative voltage pulse and read with a positive voltage pulse). The line 440 therefore illustrates a distribution of higher threshold voltage magnitudes, in accordance with an embodiment.

Referring to graph 433, the line 434 shows a distribution of threshold voltages exhibited by memory cells programmed with a logic 0 when read with a negative voltage pulse, in accordance with an embodiment. Thus, under the programming convention illustrated in FIG. 4C, the line 434 shows a distribution of threshold voltages exhibited by a memory cell that is programmed and read with voltage pulses having the same polarity. The line 434 therefore illustrates a distribution of lower threshold voltages, in accordance with an embodiment. The line 432 shows a distribution of threshold voltages exhibited by memory cells programmed with a logic 1 when read with a negative voltage pulse. Thus, under the programming convention illustrated in FIG. 4C, the line 432 shows a distribution of threshold voltage magnitudes exhibited by a memory cell that is programmed and read with voltage pulses having different polarities (e.g., programmed with a positive voltage pulse and read with a negative voltage pulse). The line 432 therefore illustrates a distribution of higher threshold voltage magnitudes, in accordance with an embodiment.

As mentioned above with respect to FIG. 3B, in accordance with an embodiment, the distributions of higher and lower threshold voltages are separated by a window. For example, graph 431 shows that at the 50th percentile the distribution 438 and the distribution 440 are separated by a window 442. Similarly, graph 433 shows that at the 50th percentile the distribution 434 and the distribution 432 are separated by a window 436. In embodiments, the windows 442 and 436 can be the same or different depending on the relative distributions. The graphs 431 and 433 also show that the distributions of lower threshold voltage magnitudes and higher threshold voltage magnitudes can overlap, especially at the tails of the distributions, in accordance with an embodiment. For example, the graph 431 shows a range 444 of threshold voltage magnitudes in which the distributions 438 and 440 overlap. Similarly, the graph 433 shows a range 446 of threshold voltage magnitudes in which the distributions 432 and 434 overlap. The overlap 444, 446 can occur due to, for example, local variations of material composition or dimensions of the individual memory cells. Therefore, when performing a single-polarity read, access circuitry that attempts to read a memory cell that falls within the ranges 444, 446 of overlap can mistakenly read a cell that is a logic 1 as a logic 0, or vice versa. In some cases, error correction mechanisms can detect or correct such errors. However, if the distribution overlap is significant, then it may be impractical to rely on error correction mechanisms to handle the errors.

Figure 5:
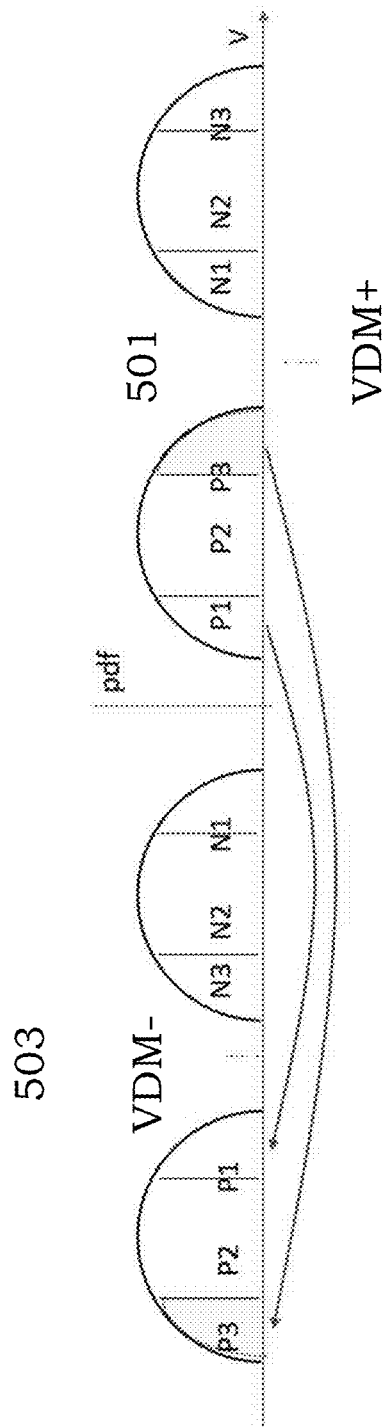
FIG. 5 is a diagram illustrating a hypothesis on various cell distributions in accordance with an embodiment of the present disclosure.

In one embodiment, a double-polarity read sequence enables correctly reading values stored in memory cells even when the threshold voltage distributions overlap, in accordance with an embodiment. FIG. 5 is a diagram illustrating a hypothesis on various cell distributions in accordance with an embodiment of the present disclosure. The distribution shown and described below in the present disclosure is a different form as mentioned above, which is used to indicate whether the distributions of the memory cells with different logic states overlap more intuitively.

As shown in FIG. 5, sector 501 illustrates the distribution of threshold voltage magnitudes in response to a positive polarity read (for instance positive voltage), in accordance with an embodiment. The sector 503 illustrates the distribution of threshold voltage magnitudes in response to a negative polarity read (for instance negative voltage), in accordance with an embodiment. For illustrative purposes, FIG. 5 adopts a particular programming convention that assumes access circuitry applies a positive programming pulse to program a cell to a logic 1, and a negative programming pulse to program the cell to a logic 0. However, another embodiment can adopt the opposite programming convention (e.g., a positive programming pulse can result in a logic 0 and a negative programming pulse can result in a logic 1).

As shown in FIG. 5, for example, P1, P2, and P3 may indicate three portions of the memory cells programmed to be, for instance, logic 1, and N1, N2, and N3 may indicate three portions of the memory cells programmed to be, for instance, logic 0. When reading in a positive way, for example, with a positive voltage, the distributions of the threshold voltages (positive voltages) of the memory cells are: P1<P2<P3<N1<N2<N3. Contrarily, when reading in a negative way, for example, with a negative voltage, the distributions of the threshold voltages (negative voltages) of the memory cells are: |P3|>|P2|>|P1|>|N3|>|N2|>|N1|. Therefore, if the read is made in the positive way, a read voltage VDM+ may be selected to be greater than the expected highest threshold voltage of the memory cells programmed to be logic 1 and lower than the expected lowest threshold voltage of the memory cells programmed to be logic 0, and if the read is made in the negative way, a read voltage VDM− may be selected to have a magnitude greater than the expected highest threshold voltage magnitude of the memory cells programmed to be logic 0 and lower than the expected lowest threshold voltage magnitude of the memory cells programmed to be logic 1. In this case, the memory cells can be read correctly.

However, in fact, the distributions of the threshold voltages of the memory cells programmed to be different logic states may be not completely separated without any overlaps as shown in FIG. 5. Also, as mentioned above with respect to FIG. 4C, in accordance with an embodiment, the distributions of higher and lower threshold voltages may be separated by a window, but they can also overlap, especially at the tails of the distributions, in accordance with an embodiment. For this regard, a further description will be made with respect to FIGS. 6A-6B.

Figure 6A:
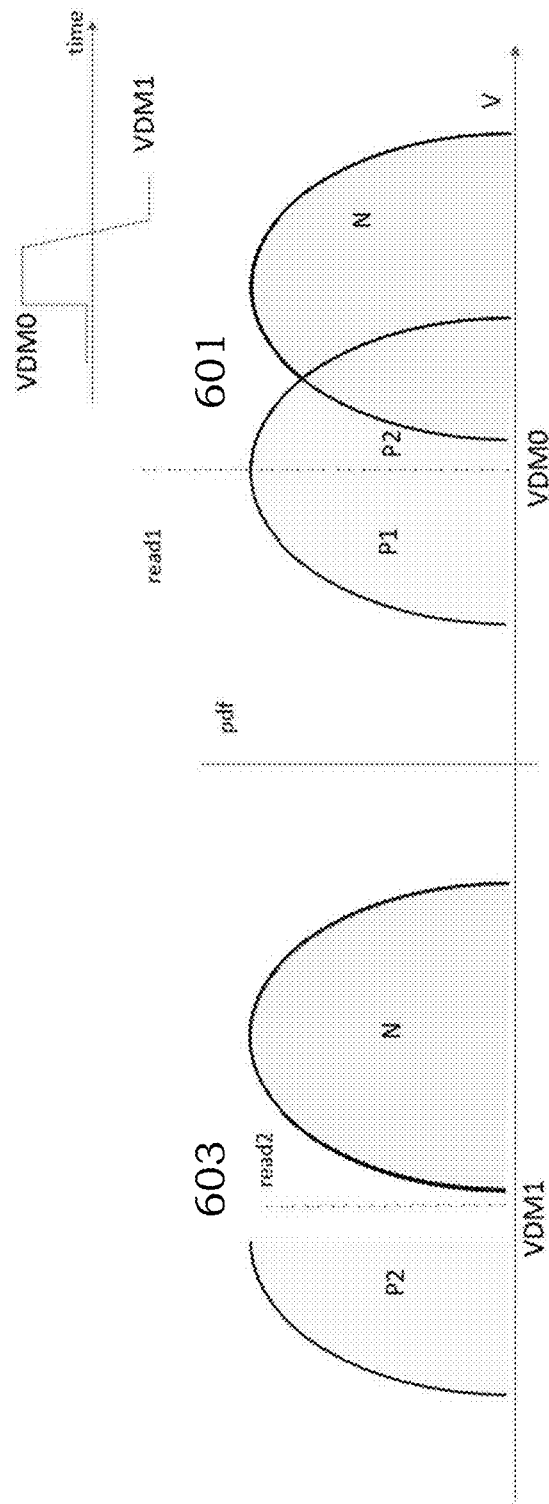
FIG. 6A is a diagram illustrating a double-polarity read of memory cells in accordance with an embodiment of the present disclosure.

As can be seen from FIG. 6A, there is an overlapped portion at the tails of the distributions. Sector 601 illustrates application of a first voltage (VDM0). In the illustrated embodiment, the first voltage may have a positive polarity, and is thus "coherent" with the memory cells programmed to logic 1 with a positive voltage. In one embodiment, the magnitude of VDM0 is selected to be lower than an expected lowest threshold voltage magnitude of cells programmed to the "0" logic state, e.g., lower than the lowest threshold voltage of cells corresponding to portion N. In one embodiment, the memory cells exhibit electrical responses to the first voltage. For example, in one embodiment, the memory cells can either switch or not switch in response to VDM0. In one embodiment, whether or not a given memory cell switches in response to VDM0 depends on, for example, whether the memory cell is programmed to a logic 1 or logic 0, and whether or not the memory cell exhibits threshold voltages in the range of overlap between the distributions. In one embodiment, a memory cell switches in response to an applied voltage if the applied voltage has a magnitude that is greater than the exhibited threshold voltage. Therefore, the plurality of memory cells can be grouped based on their response to the first voltage, including: memory cells that are programmed with a logic 1 that switch in response to the first voltage (e.g., the memory cell corresponding to portion P1); memory cells that are programmed with a logic 0 that do not switch in response to the first voltage (e.g., the memory cells corresponding to the portion N); and memory cells that are programmed with a logic 1, but that do not switch in response to the first voltage (e.g., the memory cells corresponding to portion P2), for example some memory cells of which exhibit a threshold voltage that falls within the overlap of distributions. In this case, the logic state of the memory cells corresponding to portion P1 can be determined, e.g., logic 1. However, the logic state of the memory cells corresponding to other portions, for example, P2 and N, cannot be determined.

In one such embodiment, VDM0 may have a polarity and magnitude to correctly identify the logic 1 memory cells that switch in response to the VDM0. For example, the magnitude of VDM0 is high enough to cause the memory cells corresponding to portion P1 to threshold, and thus enable access circuitry to read those memory cells as a logic 1. In addition to correctly ascertaining that the memory cells corresponding to the portion P1 are logic 1, in one embodiment, application of VDM0 also refreshes or reinforces the data stored in the memory cells that switch. In one such embodiment, the memory cells corresponding to the portion P1 get reinforced in response to the first voltage because those memory cells experience a threshold event, and therefore the application of the first voltage has a programming effect. In one such example, the read polarity is coherent with program polarity of cells that switch, so the read pulse and corresponding threshold event has the same effect as a write pulse that programs the same logic state already stored in the memory cell. Thus, in one embodiment, application of the VDM0 refreshes the memory cells that switch in response to the first voltage, which can prevent drift of the switching memory cells' state.

Further, as shown in FIG. 6A, sector 603 illustrates application of a second voltage (VDM1). In the illustrated embodiment, the second voltage may have a negative polarity. In the illustrated embodiment, the access circuitry may mask the memory cells corresponding to the portion P1, which have been determined to be in logic 1, while applying the second voltage. In one embodiment, masking a cell correspond to switch off (i.e. ground) the corresponding digit line. In one embodiment, the magnitude of VDM1 is selected to be greater than an expected highest threshold voltage magnitude of cells programmed to the "0" logic state, e.g., greater than the highest threshold voltage magnitude of cells corresponding to portion N. In one embodiment, the memory cells exhibit electrical responses to the second voltage. For example, in one embodiment, the memory cells can either switch or not switch in response to VDM1. In one embodiment, whether or not a given memory cell switches in response to VDM1 depends on, for example, whether the memory cell is programmed to a logic 1 or logic 0, and whether or not the memory cell exhibits threshold voltages in the range of overlap between the distributions. In one embodiment, a memory cell switches in response to an applied voltage if the applied voltage has a magnitude that is greater than the exhibited threshold voltage. Therefore, the plurality of memory cells can be grouped based on their response to the second voltage, including: memory cells that are programmed with a logic 0 that switch in response to the second voltage (e.g., the memory cells corresponding to portion N); and memory cells that are programmed with a logic 1 that do not switch in response to the second voltage (e.g., the memory cells corresponding to the portion P2). In this case, the logic state of the memory cells corresponding to portion N can be determined, e.g., logic 0. Meanwhile, the logic state of the memory cells corresponding to the remaining portion, for example, portion P2, can also be determined, e.g., logic 1.

Figure 6B:
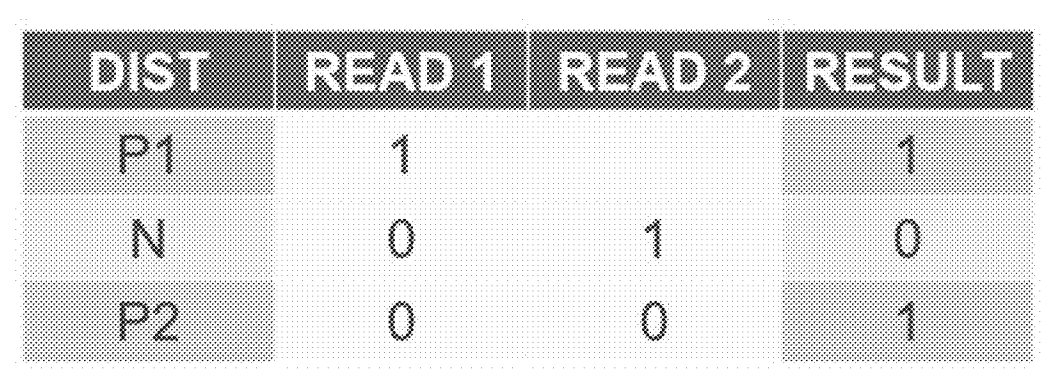

FIG. 6B illustrates the results of the double-polarity read corresponding to FIG. 6A. In the distributions, when memory cells are read with the first voltage (VDM0), the memory cells corresponding to portion P1 can be determined to be at logic 1; when memory cells are read with the second voltage (VDM1), the memory cells corresponding to portion N can be determined to be at logic 0, and the memory cells corresponding to portion P2 can be determined to be at logic 1. Because the logic state of memory cells corresponding to portion P1 has been determined based on the application of the first voltage, it is not necessary to apply the second voltage to these memory cells.

As mentioned above, in one embodiment of the present disclosure, even though the distributions of higher and lower threshold voltages may overlap at the tails of the distributions, the logic state of the memory cells can also be determined correctly by the double-polarity read according to the embodiment of the present disclosure, in particular, based on reading for two times, i.e., the first reading with the application of the first voltage (VDM0) and the second reading with the application of the second voltage (VDM1).

Moreover, the inventor further found that, in the distributions of the threshold voltages of memory cells, if a window for separating the threshold voltages of the memory cells corresponding to portion P2 and those corresponding to portion N is small, it may be difficult to select the magnitude of the second voltage (VDM1) during the second reading, because it is required to determine the magnitude of the second voltage precisely in the small window. In other word, the error rates during reading memory cells may be high. Therefore, it is desired to find a way to further reduce the error rates during reading memory cells.

Figure 7A:
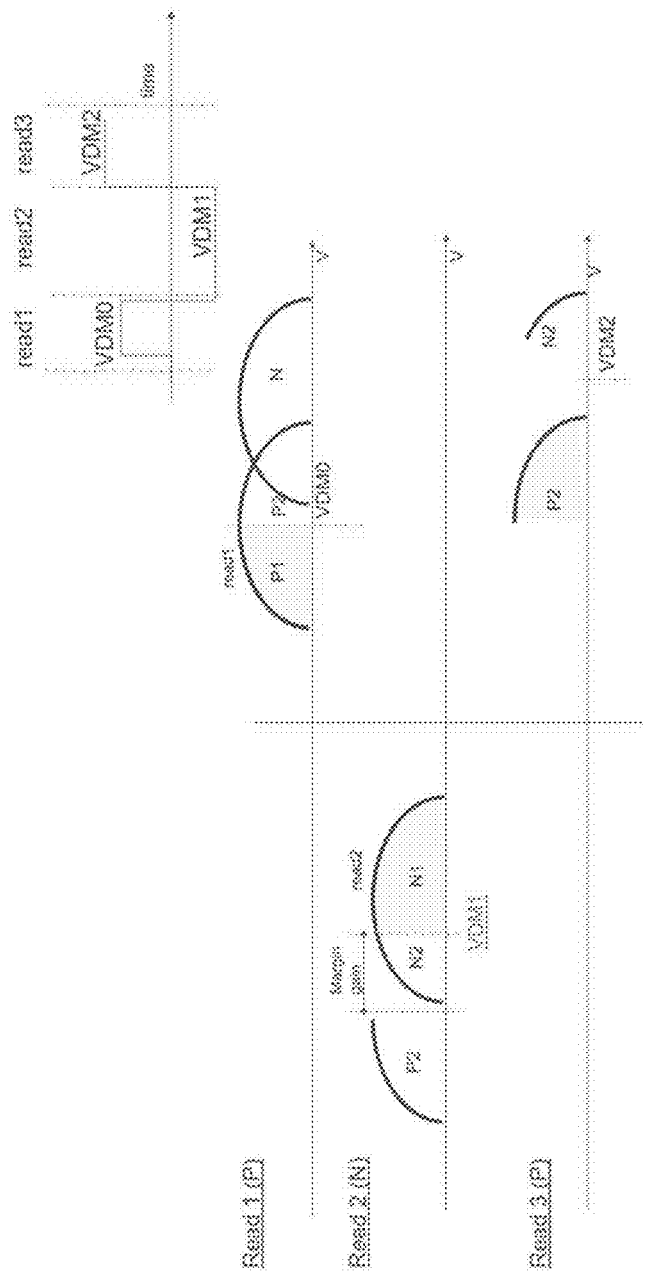
FIG. 7A is a diagram illustrating another double-polarity read of memory cells in accordance with an embodiment of the present disclosure.

FIG. 7A is a diagram illustrating another double-polarity read of memory cells in accordance with an embodiment of the present disclosure, and FIG. 7B is a chart illustrating results of the double-polarity read corresponding to FIG. 7A in accordance with an embodiment of the present disclosure.

The embodiment of FIG. 7A differs from that of FIG. 6A in: 1) VDM1 with which the memory cells are read in FIG. 7A may have a magnitude lower than that of the VDM1 with which the memory cells are read in FIG. 6A; and 2) a third reading is required to determine the logic state of the memory cells. The further detailed description will be made below.

As shown in FIG. 7A, during a first reading (Read 1), which may be made in a positive way, the access circuitry may apply a first voltage (VDM0) to the memory cells. The operations for the first reading are the same as mentioned above with respect to FIG. 6A, which will thus not be described for avoiding redundancy.

Further, as shown in FIG. 7A, during a second reading (Read 2), which may be made in a negative way, the access circuitry may apply a second voltage (VDM1) to the memory cells. In the illustrated embodiment, the second voltage may have a negative polarity. In the illustrated embodiment, the access circuit may mask the memory cells corresponding to the portion P1, which have been determined to be in logic 1, while applying the second voltage. In one embodiment, the magnitude of VDM1 is selected to be lower than an expected highest threshold voltage magnitude of cells programmed to the "0" logic state, e.g., lower than the highest threshold voltage magnitude of cells corresponding to portion N, which is lower than the magnitude of VDM1 shown in FIG. 6A. In one embodiment, the memory cells exhibit electrical responses to the second voltage. For example, in one embodiment, the memory cells can either switch or not switch in response to VDM1. In one embodiment, whether or not a given memory cell switches in response to VDM1 depends on, for example, whether the memory cell is programmed to a logic 1 or logic 0, and whether or not the memory cell exhibits threshold voltages in the range of overlap between the distributions. In one embodiment, a memory cell switches in response to an applied voltage if the applied voltage has a magnitude that is greater than the exhibited threshold voltage. Therefore, the plurality of memory cells can be grouped based on their response to the second voltage, including: memory cells that are programmed with a logic 0 that switch in response to the second voltage (e.g., the memory cell corresponding to portion N1); memory cells that are programmed with a logic 0 that do not switch in response to the second voltage (e.g., the memory cells corresponding to the portion N2); and memory cells that are programmed with a logic 1 that do not switch in response to the second voltage (e.g., the memory cells corresponding to portion P2). In this case, the logic state of the memory cells corresponding to portion N1 can be determined, e.g., logic 0. However, the logic state of the memory cell corresponding to other portions, for example, P2 and N2, cannot be determined.

In one such embodiment, VDM1 may have a polarity and magnitude to correctly identify the logic 0 memory cells that switch in response to the VDM1. For example, the magnitude of VDM1 is high enough to cause the memory cells corresponding to portion N1 to threshold, and thus enable access circuitry to read those memory cells as a logic 0. In addition to correctly ascertaining that the memory cells corresponding to the portion N1 are logic 0, in one embodiment, application of VDM1 also refreshes or reinforces the data stored in the memory cells that switch. In one such embodiment, the memory cells corresponding to the portion N1 get reinforced in response to the second voltage because those memory cells experience a threshold event, and therefore the application of the second voltage has a programming effect. In one such example, the read polarity is coherent with program polarity of cells that switch, so the read pulse and corresponding threshold event has the same effect as a write pulse that programs the same logic state already stored in the memory cell. Thus, in one embodiment, application of the VDM1 refreshes the memory cells that switch in response to the second voltage, which can prevent drift of the switching memory cells' state.

Furthermore, as shown in FIG. 7A, during a third reading (Read 3), which may be made in a positive way, the access circuitry may apply a third voltage (VDM2) to the memory cells. In the illustrated embodiment, the third voltage may have a positive polarity. In the illustrated embodiment, the access circuitry may mask the memory cells corresponding to the portions P1 and N1, which have been determined to be in logic 1 or logic 0, while applying the third voltage. In one embodiment, the magnitude of VDM2 is selected to be greater than an expected highest threshold voltage magnitude of cells programmed to the "1" logic state, e.g., greater than the highest threshold voltage magnitude of cells corresponding to portion P2, which is thus greater than that of the first voltage (VDM0). In one embodiment, the memory cells exhibit electrical responses to the third voltage. For example, in one embodiment, the memory cells can either switch or not switch in response to VDM2. In one embodiment, whether or not a given memory cell switches in response to VDM2 depends on, for example, whether the memory cell is programmed to a logic 1 or logic 0, and whether or not the memory cell exhibits threshold voltages in the range of overlap between the distributions. In one embodiment, a memory cell switches in response to an applied voltage if the applied voltage has a magnitude that is greater than the exhibited threshold voltage. Therefore, the plurality of memory cells can be grouped based on their response to the third voltage, including: memory cells that are programmed with a logic 1 that switch in response to the third voltage (e.g., the memory cells corresponding to portion P2); and memory cells that are programmed with a logic 0 that do not switch in response to the third voltage (e.g., the memory cells corresponding to the portion N2). In this case, the logic state of the memory cells corresponding to portion P2 can be determined, e.g., logic 1. Meanwhile, the logic state of the memory cells corresponding to other portion, for example, N2, can also be determined, e.g., logic 0.

In one such embodiment, VDM2 may have a polarity and magnitude to correctly identify the logic 1 memory cells that switch in response to the VDM2. For example, the magnitude of VDM2 is low enough to cause the memory cells corresponding to portion P2 to threshold, and thus enable access circuitry to read those memory cells as a logic 1. In addition to correctly ascertaining that the memory cells corresponding to the portion P2 are logic 1, in one embodiment, application of VDM2 also refreshes or reinforces the data stored in the memory cells that switch. In one such embodiment, the memory cells corresponding to the portion P2 get reinforced in response to the third voltage because those memory cells experience a threshold event, and therefore the application of the third voltage has a programming effect. In one such example, the read polarity is coherent with program polarity of cells that switch, so the read pulse and corresponding threshold event has the same effect as a write pulse that programs the same logic state already stored in the memory cell. Thus, in one embodiment, application of the VDM2 refreshes the memory cells that switch in response to the third voltage, which can prevent drift of the switching memory cells' state.

FIG. 7B illustrates the results of the double-polarity read corresponding to FIG. 7A. In the distributions, when memory cells are read with the first voltage (VDM0), the memory cells corresponding to portion P1 can be determined to be in logic 1; when memory cells are read with the second voltage (VDM1), the memory cells corresponding to portion N1 can be determined to be in logic 0; when memory cells are read with the third voltage (VDM2), the memory cells corresponding to portion P2 can be determined to be in logic 1, and the memory cells corresponding to portion N2 can be determined to be in logic 0. In one embodiment, the first voltage (VDM0) may be applied to all memory cells, the second voltage (VDM1) may be applied to the memory cells corresponding to portions P2 and N, and the third voltage (VDM2) may be applied to the memory cells corresponding to the portions P2 and N2. That is to say, when respective read voltage is applied to the memory cells, those memory cells of which the logic states have been determined will be masked by the access circuitry, in order to avoid unnecessarily programming for those memory cells and increasing the power consumption.

As can be seen from the embodiment of the present disclosure shown in FIG. 7A, even though the number of times for reding the memory cells is increased by one, a higher margin can be obtained by selecting a read voltage (e.g., VDM1) having a lower magnitude during the second reading, compared to the embodiment shown in FIG. 6A. The possibility where the logic state of a memory cell is not determined correctly can be reduced, which can thereby reduce the error rates during reading the memory cells.

Figure 8A:
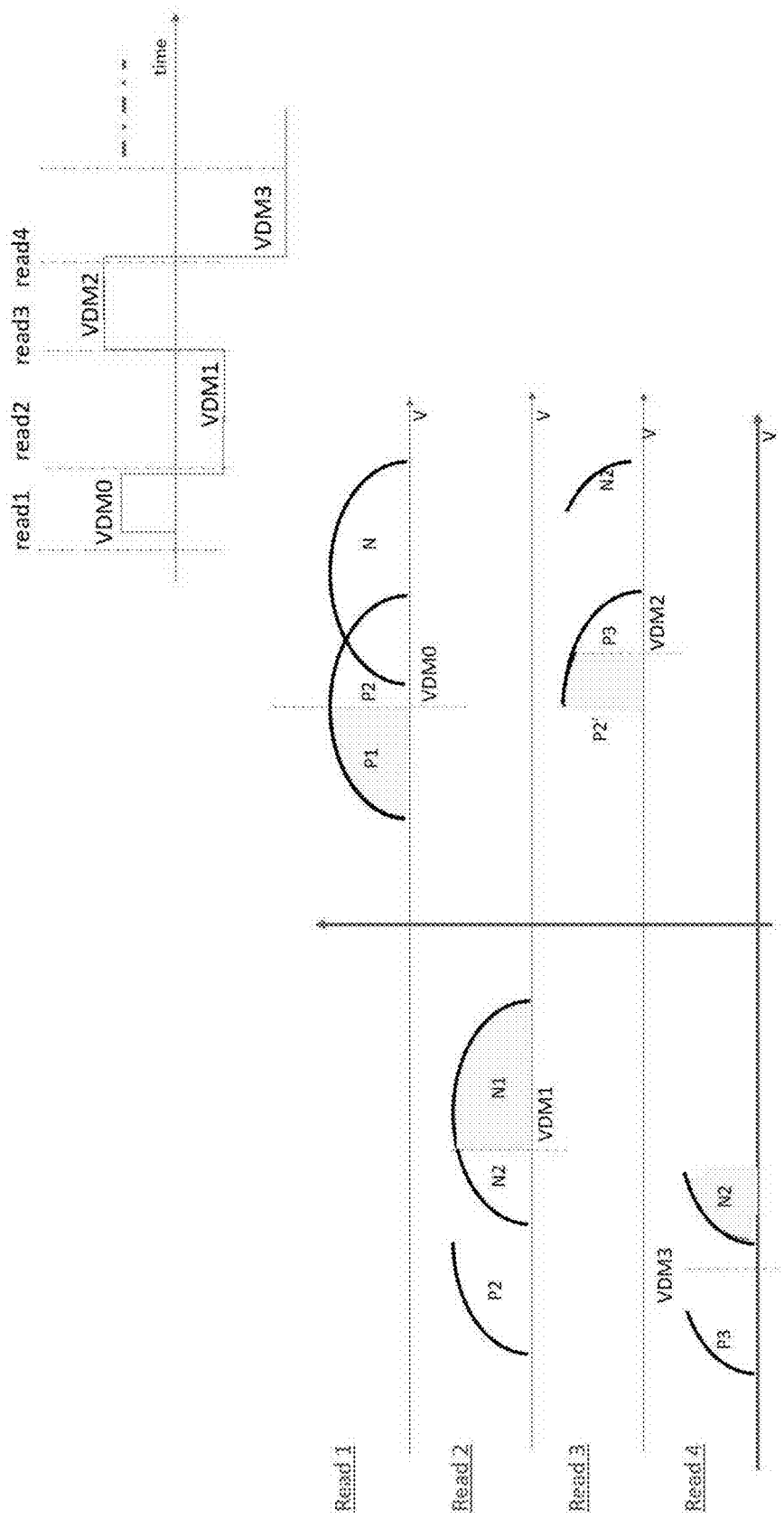
FIG. 8A is a diagram illustrating a further double-polarity read of memory cells in accordance with an embodiment of the present disclosure.

FIG. 8A is a diagram illustrating a further double-polarity read of memory cells in accordance with an embodiment of the present disclosure, and FIG. 8B is a chart illustrating results of the double-polarity read corresponding to FIG. 8A in accordance with an embodiment of the present disclosure.

The embodiment of FIG. 8A differs from that of FIG. 7A in: 1) VDM2 with which the memory cells are read in FIG. 8A may have a magnitude lower than that of the VDM2 with which the memory cells are read in FIG. 7A; and 2) a fourth reading is required to determine the logic state of the memory cells. The further detailed description will be made below.

The operations for the first reading (Read 1) and the second reading (Read 2) in FIG. 8A are the same as those in FIG. 7A, and thus the descriptions thereof will be omitted for avoiding redundancy.

Furthermore, as shown in FIG. 8A, during a third reading (Read 3), which may be made in a positive way, the access circuit may apply a third voltage (VDM2) to the memory cells. In the illustrated embodiment, the third voltage may have a positive polarity. In the illustrated embodiment, the access circuitry may mask the memory cells corresponding to the portions P1 and N1, which have been determined to be in logic 1 or logic 0, while applying the third voltage. In one embodiment, the magnitude of VDM2 is selected to be lower than an expected highest threshold voltage magnitude of cells programmed to the "1" logic state, e.g., lower than the highest threshold voltage magnitude of cells corresponding to portion P3, and greater than that of the first voltage (VDM0). In one embodiment, the memory cells exhibit electrical responses to the third voltage. For example, in one embodiment, the memory cells can either switch or not switch in response to VDM2. In one embodiment, whether or not a given memory cell switches in response to VDM2 depends on, for example, whether the memory cell is programmed to a logic 1 or logic 0, and whether or not the memory cell exhibits threshold voltages in the range of overlap between the distributions. In one embodiment, a memory cell switches in response to an applied voltage if the applied voltage has a magnitude that is greater than the exhibited threshold voltage. Therefore, the plurality of memory cells can be grouped based on their response to the third voltage, including: memory cells that are programmed with a logic 1 that switch in response to the third voltage (e.g., the memory cells corresponding to portion P2'); memory cells that are programmed with a logic 1 that do not switch in response to the third voltage (e.g., the memory cells corresponding to portion P3); and memory cells that are programmed with a logic 0 that do not switch in response to the third voltage (e.g., the memory cells corresponding to the portion N2). In this case, the logic state of the memory cells corresponding to portion P2' can be determined, e.g., logic 1. However, the logic state of the memory cells corresponding to other portions, for example, P3 and N2, cannot be determined.

In one such embodiment, VDM2 may have a polarity and magnitude to correctly identify the logic 1 memory cells that switch in response to the VDM2. For example, the magnitude of VDM2 is high enough to cause the memory cells corresponding to portion P2' to threshold, and thus enable access circuitry to read those memory cells as a logic 1. In addition to correctly ascertaining that the memory cells corresponding to the portion P2' are logic 1, in one embodiment, application of VDM2 also refreshes or reinforces the data stored in the memory cells that switch. In one such embodiment, the memory cells corresponding to the portion P2' get reinforced in response to the third voltage because those memory cells experience a threshold event, and therefore the application of the third voltage has a programming effect. In one such example, the read polarity is coherent with program polarity of cells that switch, so the read pulse and corresponding threshold event has the same effect as a write pulse that programs the same logic state already stored in the memory cell. Thus, in one embodiment, application of the VDM2 refreshes the memory cells that switch in response to the third voltage, which can prevent drift of the switching memory cells' state.

Moreover, as shown in FIG. 8A, during a fourth reading (Read 4), which may be made in a negative way, the access circuitry may apply a fourth voltage (VDM3) to the memory cells. In the illustrated embodiment, the fourth voltage may have a negative polarity. In the illustrated embodiment, the access circuitry may mask the memory cells corresponding to the portions P1, N1, and P2', which have been determined to be in logic 1 or logic 0, while applying the fourth voltage. In the illustrated embodiment, the magnitude of VDM3 is selected to be greater than an expected highest threshold voltage magnitude of cells programmed to the "0" logic state, e.g., greater than the highest threshold voltage magnitude of cells corresponding to portion N2, which is thus greater than the magnitude of the second voltage (VDM1). In one embodiment, the memory cells exhibit electrical responses to the fourth voltage. For example, in one embodiment, the memory cells can either switch or not switch in response to VDM3. In one embodiment, whether or not a given memory cell switches in response to VDM3 depends on, for example, whether the memory cell is programmed to a logic 1 or logic 0, and whether or not the memory cell exhibits threshold voltages in the range of overlap between the distributions. In one embodiment, a memory cell switches in response to an applied voltage if the applied voltage has a magnitude that is greater than the exhibited threshold voltage. Therefore, the plurality of memory cells can be grouped based on their response to the fourth voltage, including: memory cells that are programmed with a logic 0 that switch in response to the fourth voltage (e.g., the memory cells corresponding to portion N2); and memory cells that are programmed with a logic 1 that do not switch in response to the fourth voltage (e.g., the memory cells corresponding to portion P3). In this case, the logic state of the memory cells corresponding to portion N2 can be determined, e.g., logic 0. Meanwhile, the logic state of the memory cells corresponding to other portions, for example, P3, can also be determined, e.g., logic 1.

In one such embodiment, VDM3 may have a polarity and magnitude to correctly identify the logic 0 memory cells that switch in response to the VDM3. For example, the magnitude of VDM3 is low enough to cause the memory cells corresponding to portion N2 to threshold, and thus enable access circuitry to read those memory cells as a logic 0. In addition to correctly ascertaining that the memory cells corresponding to the portion N2 are logic 0, in one embodiment, application of VDM3 also refreshes or reinforces the data stored in the memory cells that switch. In one such embodiment, the memory cells corresponding to the portion N2 get reinforced in response to the fourth voltage because those memory cells experience a threshold event, and therefore the application of the fourth voltage has a programming effect. In one such example, the read polarity is coherent with program polarity of cells that switch, so the read pulse and corresponding threshold event has the same effect as a write pulse that programs the same logic state already stored in the memory cell. Thus, in one embodiment, application of the VDM3 refreshes the memory cells that switch in response to the fourth voltage, which can prevent drift of the switching memory cells' state.

FIG. 8B illustrates the results of the double-polarity read corresponding to FIG. 8A. In the distributions, when memory cells are read with the first voltage (VDM0), the memory cells corresponding to portion P1 can be determined to be in logic 1; when memory cells are read with the second voltage (VDM1), the memory cells corresponding to portion N1 can be determined to be in logic 0; when memory cells are read with the third voltage (VDM2), the memory cells corresponding to portion P2' can be determined to be in logic 1; and when memory cells are read with the fourth voltage (VDM3), the memory cells corresponding to portion N2 can be determined to be in logic 0, and the memory cells corresponding to portion P3 can be determined to be in logic 1. In one embodiment, the first voltage (VDM0) may be applied to all memory cells, the second voltage (VDM1) may be applied to the memory cells corresponding to portions P2 and N, the third voltage (VDM2) may be applied to the memory cells corresponding to the portions P2 and N2, and the fourth voltage (VDM3) may be applied to the memory cells corresponding to the portions P3 and N2. That is to say, when respective read voltage is applied to the memory cells, those memory cells of which the logic states have been determined will be masked by the access circuitry, in order to avoid unnecessarily programming for those memory cells and increasing the power consumption.

As can be seen from the embodiment of the present disclosure shown in FIG. 8A, even though the number of times for reding the memory cells is increased by one, a higher margin can be obtained by selecting a read voltage (e.g., VDM2) having a lower magnitude during the third reading, compared to the embodiment shown in FIG. 7A. The possibility where the logic state of a memory cell is not determined correctly can be reduced, which can thereby further reduce the error rates during reading the memory cells.

It is noted that, according to the embodiments of the present disclosure, the number of times for reading the memory cells can be 4, 5, 6 or more. In general, the more the number of times for reading the memory cells is, the lower the error rate during reading the memory cells is. Considering the reading speed for the memory cells, there may be a compromise between the number of times for reading the memory cells and the error rates during reading the memory cells. In other words, the number of times for reading the memory cells can be preset before reading the memory cells.

According to an embodiment of the present disclosure, the selection of the proper read voltage is performed by defining said read voltage VDMi as the voltage that corresponds to a deterministic number of bit switched. At this regard, a counter configured to account for the number of cells that undergo a threshold event during reading may be used. In the reading operation, a voltage ramp is applied, in such a way that the increasing bias voltage is increased from zero until the number of switched bits reaches a predetermined value.

More in particular, according to this embodiment, if the total number of cells programmed with logic 1 is J and the total number of cells programmed with logic 0 is K, then the first read voltage corresponds to a first ramp given for a certain time until the number of switched bit is equal to aJ, where a is 0<a<1 and is selected according to the needs and circumstances, for example ½. Then, a second ramp is applied for a certain time and increased from zero until the increased number of switched bits read is equal to −bK, where −1<b<0 and is selected according to the needs and circumstances, for example −⅔. This second ramp corresponds to the second read voltage. Then, a third ramp is applied and is increased from zero until the increased number of switched bits read is equal to cJ, where c is 0<c<(1−a) and is selected according to the needs and circumstances, for example ¼. This third ramp corresponding to the third read voltage. Then, a fourth ramp is applied and is increased (with a negative slope) from zero until the increased number of switched bites read is equal to K+bK. This fourth ramp corresponds to the fourth read voltage.

Figure 9:
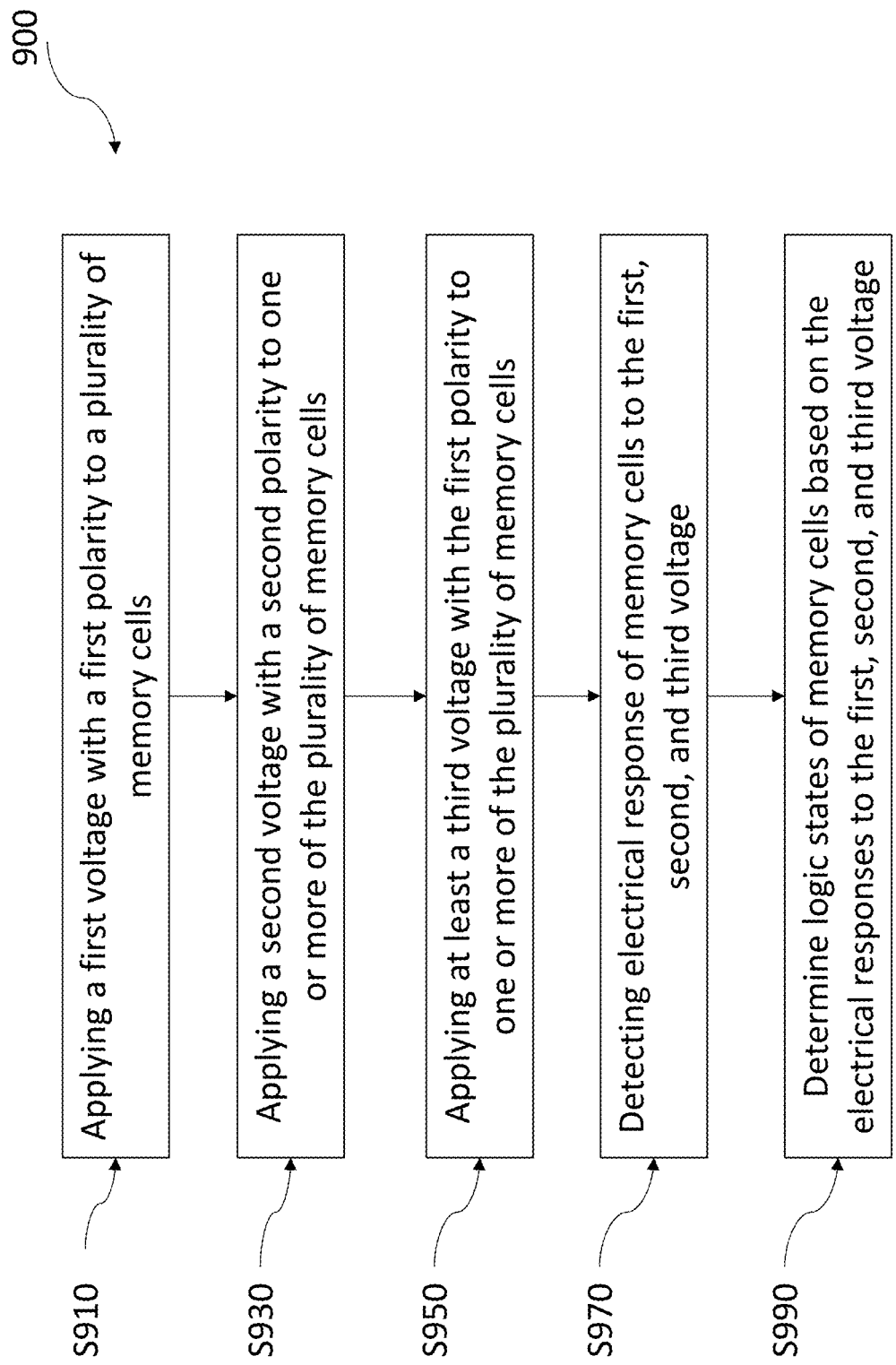
FIG. 9 is a flowchart illustrating a method of reading memory cells in accordance with an embodiment of the present disclosure.
Figure 11:
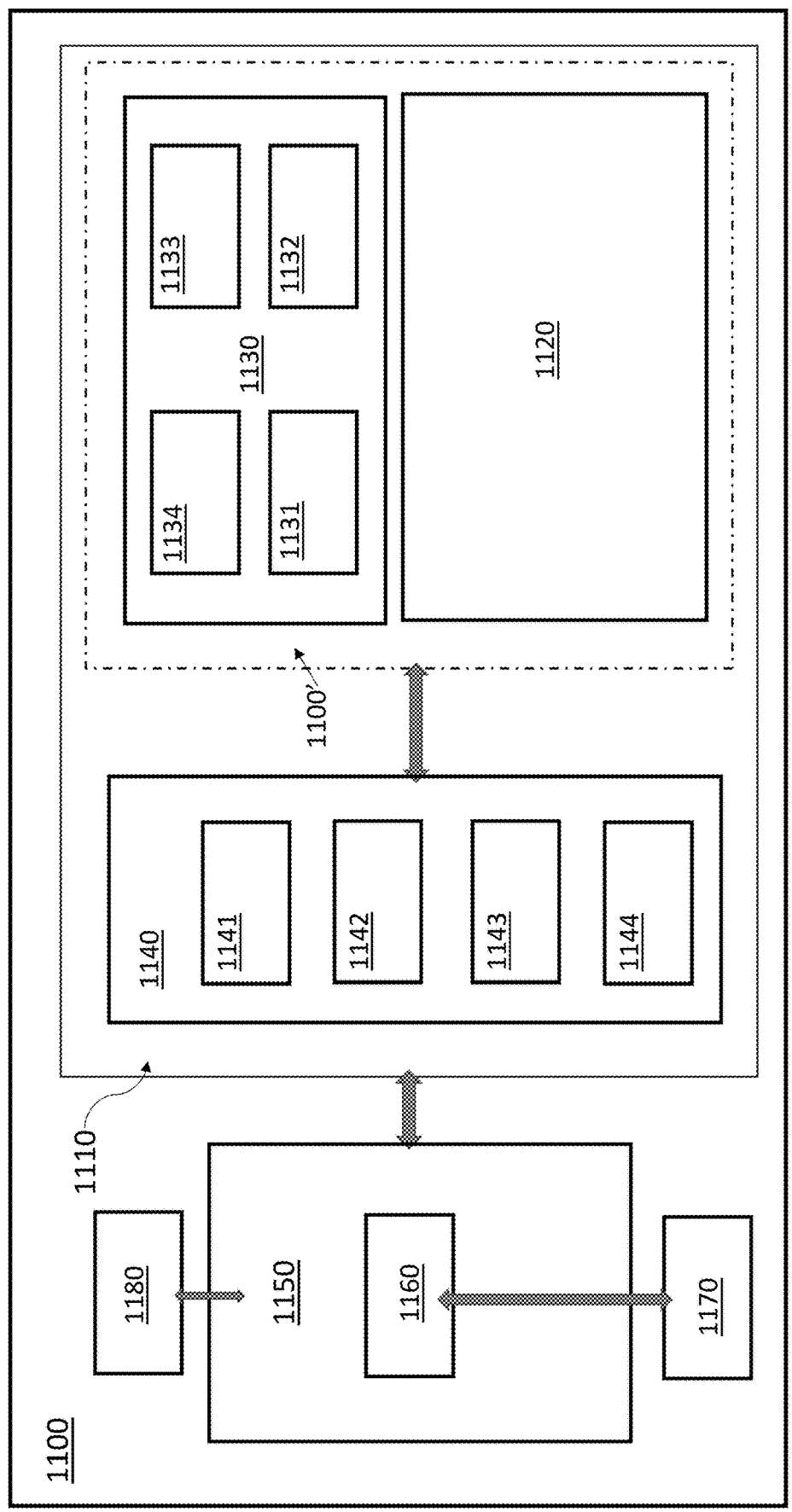
FIG. 11 is a diagram illustrating a system of reading memory cells in accordance with an embodiment of the present disclosure.

FIG. 9 is a flowchart illustrating a method of reading memory cells in accordance with an embodiment of the present disclosure. The processes described with respect to FIG. 9 can be performed by hardware logic and circuitry. An example of circuitry that can perform double-polarity reads is illustrated in FIG. 11. For example, the following processes are described as being performed by access circuitry and sense circuitry, such as the access circuitry and sense circuitry which will be described with respect to FIG. 11 below. However, other embodiments can include different circuitry configurations suitable for performing the processes.

Referring to FIG. 9, the method 900 is a method of performing a double-polarity read sequence, in accordance with an embodiment, comprising: applying a first voltage with a first polarity to a plurality of memory cells (S910); applying a second voltage with a second polarity to one or more of the plurality of memory cells (S930); applying at least a third voltage with the first polarity to one or more of the plurality of memory cells (S950); detecting electrical response of memory cells to the first, second, and third voltage (S970); and determine logic states of memory cells based on the electrical responses to the first, second, and third voltage (S990). It is noted that the steps shown in FIG. 9 is only for an illustrative purpose, without indicating that the steps are performed as this order. In particular, after applying a read voltage to a memory cell, a step of detecting an electrical response to the read voltage may be performed, and then a step of determining a logic state of a memory cell may also be performed based on the electrical response. A more detailed description of the method will be made below.

In one embodiment of the present disclosure, prior to reading the memory cells, access circuitry writes data to a plurality of memory cells. For example, access circuitry writes logic 0s and logic is to a plurality of memory cells such as the memory cell 100 of FIG. 1. In one embodiment, access circuitry can write logic 0s by applying programming pulses with a negative polarity and logic is by applying programming pulses with a positive polarity. The opposite convention can also be adopted.

After writing data to the plurality of memory cells, access circuitry can read the plurality of memory cells using a double-polarity read sequence. In one embodiment, a double-polarity read sequence involves applying a first voltage with a first polarity to the plurality of memory cells, at step S910. The first voltage can be same as VDM0 described with respect to FIG. 7A and FIG. 8A for example. As mentioned above, the shape of the voltage pulse can be box-shaped, ramped, or another suitable shape for causing the memory cell to exhibit a threshold voltage. The magnitude and duration of the first voltage pulse can be the same as described above with respect to FIG. 1, or another suitable magnitude and duration to cause the memory cells to exhibit electrical responses to enable reading the memory cells.

After applying the first voltage, a sense circuitry detects a first electrical response of the plurality of memory cells to the first voltage. For example, in one embodiment, the sense circuitry detects one of a voltage drop (e.g., a threshold voltage) across terminals of a given memory cell, current through the given memory cell, and a threshold event of the given memory cell. In one embodiment, detecting a threshold voltage for a memory cell can include determining that the cell's threshold voltage is lower than or higher than a reference voltage, for example the first voltage.

Based on the first electrical response, the access circuitry can determine the logic state of some of the memory cells. For example, in one embodiment, the access circuitry determines if a memory cell is in a first logic state (e.g., logic 1) or if the memory cell's logic state is inconclusive based on the first electrical response. In one embodiment, the access circuitry determines that a memory cell is a logic 1 if the memory cell switches in response to the first voltage. In one embodiment in which the sense circuitry is to detect current through a given memory cell, the access circuitry is to determine the given memory cell is in the first logic state based on detection that the current is greater than or equal to a threshold current in response to the first voltage. In one embodiment, a threshold event switches the cell (e.g., the non-phase change chalcogenide self-selecting memory material) from a high resistivity to a low resistivity state, resulting in a current that is greater than or equal to a threshold current. In one embodiment, the threshold current is in the range of 1-10 µA (microamperes). However, other embodiments may have a threshold current that is lower than 1 µA or higher than 10 µA depending on, for example, the storage material's properties (e.g., conductivity of the storage material).

In one such embodiment, the access circuitry determines that the memory cell's state is inconclusive if the memory cell does not switch in response to the first voltage. In one embodiment in which the sense circuitry is to detect current through a given memory cell, the access circuitry determines the given memory cell's logic state is inconclusive if the current is less than a first threshold current in response to the first voltage. In one embodiment, access circuitry determines whether or not to apply a second voltage to the memory cells based on whether the memory cell's logic state is inconclusive based on the first voltage.

For example, if the access circuitry determines that a memory cell is in the first logic state, the access circuitry can mask the memory cell from a second voltage. If it is inconclusive as to whether the memory cell is in a first or second logic state, the access circuitry applies the second voltage with a second polarity to the memory cell.

The method 900 also involves applying a second voltage with a second polarity to one or more of the plurality of memory cells, at step 930. The second voltage has a polarity that is different than the first voltage. The duration of the second voltage pulse can be the same or similar to the first voltage pulse. In one embodiment, the second voltage can be same as VDM1 described with respect to FIG. 7A and FIG. 8A for example.

After applying the second voltage, a sense circuitry detects a second electrical response of some of the plurality of memory cells to the second voltage. For example, in one embodiment, the sense circuitry detects one of a voltage drop (e.g., a threshold voltage) across terminals of a given memory cell, current through the given memory cell, and a threshold event of the given memory cell. In one embodiment, detecting a threshold voltage for a memory cell can include determining that the cell's threshold voltage is lower than or higher than a reference voltage, for example the second voltage.

Based on the second electrical response, the access circuitry can determine the logic state of some of the memory cells. For example, in one embodiment, the access circuitry determines if a memory cell is in a second logic state (e.g., logic 0) or if the memory cell's logic state is inconclusive based on the second electrical response. In one embodiment, the access circuitry determines that a memory cell is a logic 0 if the memory cell switches in response to the second voltage. In one embodiment in which the sense circuitry is to detect current through a given memory cell, the access circuitry is to determine the given memory cell is in the second logic state based on detection that the current is greater than or equal to a threshold current in response to the second voltage. In one embodiment, a threshold event switches the cell (e.g., the non-phase change chalcogenide self-selecting memory material) from a high resistivity to a low resistivity state, resulting in a current that is greater than or equal to a threshold current. In one embodiment, the threshold current is in the range of 1-10 µA (microamperes). However, other embodiments may have a threshold current that is lower than 1 µA or higher than 10 µA depending on, for example, the storage material's properties (e.g., conductivity of the storage material).

In one such embodiment, the access circuitry determines that the memory cell's state is inconclusive if the memory cell does not switch in response to the second voltage. In one embodiment in which the sense circuitry is to detect current through a given memory cell, the access circuitry determines the given memory cell's logic state is inconclusive if the current is less than a second threshold current in response to the second voltage. In one embodiment, access circuitry determines whether or not to apply a third voltage to the memory cells based on whether the memory cell's logic state is inconclusive based on the second voltage.

For example, if the access circuitry determines that a memory cell is in the second logic state, the access circuitry can mask the memory cell from a third voltage. If it is inconclusive as to whether the memory cell is in a first or second logic state, the access circuitry applies the third voltage with a first polarity to the memory cell.

At step S950, if the third voltage is the same as VDM2 described with respect to FIG. 7A, the logic states of the plurality of memory cells can be determined after the steps of detecting and determining. If the third voltage is the same as VDM2 described with respect to FIG. 8A, after respective steps of detecting and determining, the method further comprises a step of applying a fourth voltage with the second polarity to one or more of the plurality of memory cells, which is not shown in FIG. 9. The fourth voltage can be the same as VDM3 described with respect to FIG. 8A. The memory cells of which the logic states have been determined will be masked by the access circuit while applying the fourth voltage. Then, further steps of detecting and determining will be performed. Afterwards, the logic states of the plurality of memory cells can be determined. The descriptions of the steps of detecting and determining are the same or similar as that mentioned above, which are omitted for avoiding redundancy.

Figure 10:
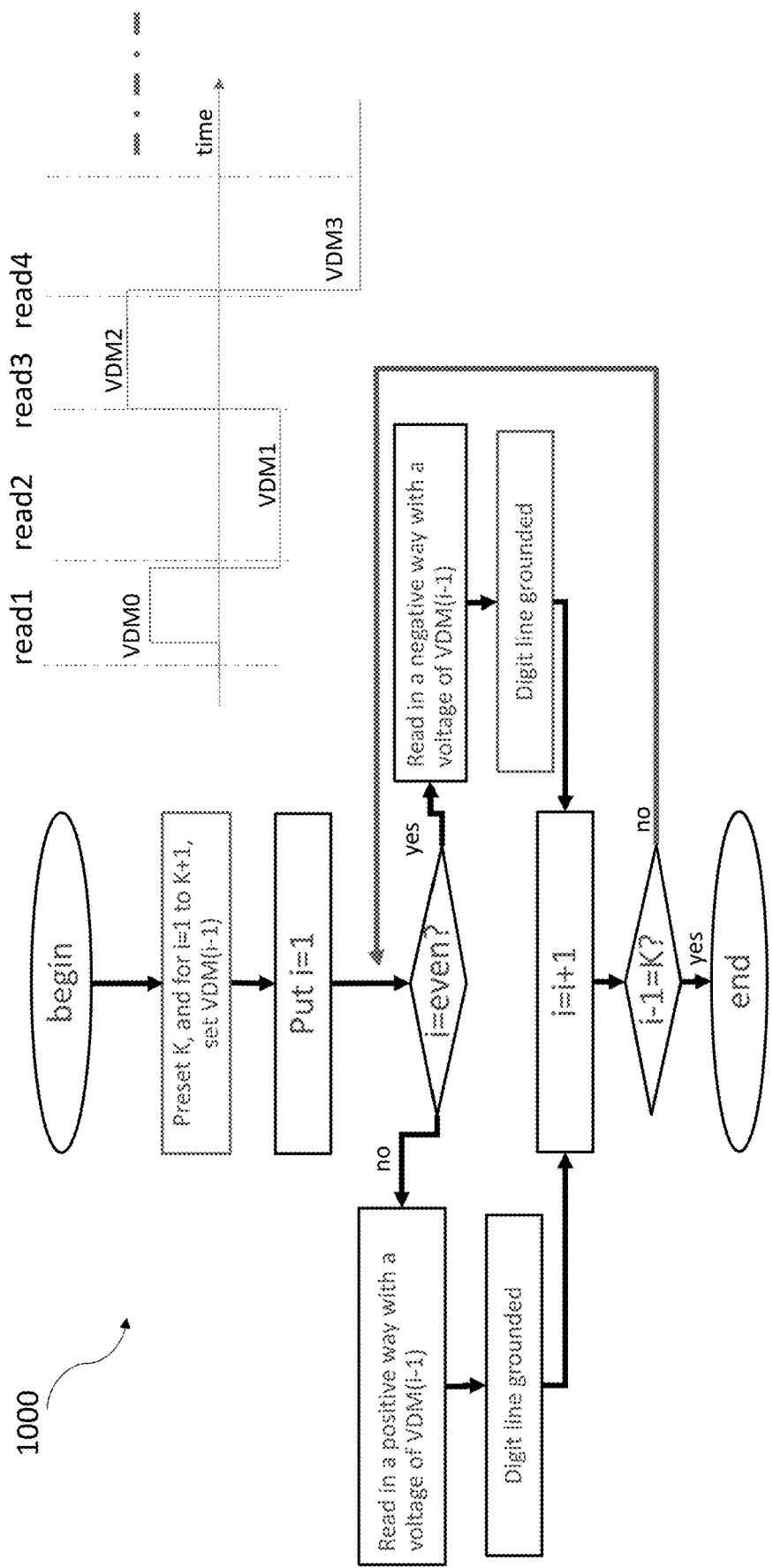
FIG. 10 is a flowchart illustrating a general method of reading memory cells in accordance with an embodiment of the present disclosure.

FIG. 10 is a flowchart illustrating a general method of reading memory cells in accordance with an embodiment of the present disclosure. In the method 1000 shown in FIG. 10, prior to reading a plurality of memory cells, the number of times for reading, K, can be preset. According to the preferred embodiment of the present disclosure, at least four readings are performed to obtain a read operation with a greatly reduced error rates, so that K may be equal to 4 in the flow chart of FIG. 10, which corresponds to the embodiment described and shown in FIG. 8A.

FIG. 11 is a diagram illustrating a system of reading memory cells in accordance with an embodiment of the present disclosure, which is a high-level scheme of a system 1100 that can perform the read sequence of the present disclosure. The system 1100 includes a memory device 1110 in turn including an array of memory cells 1120 and a circuit portion 1130 operatively coupled to the memory cells 1120; the memory cells 1120 and the circuit portions 1130 form a memory portion, herein referred to as memory portion 1100'.

The memory device 1110 comprises a memory controller 1140, which represents control logic that generates memory access commands, for example in response to command by a host 1150. Memory controller 1140 accesses memory portion 1100'. In one embodiment, memory controller 1140 can also be implemented in the host 1160, in particular as part of a host processor 1160, even if the present disclosure is not limited by a particular architecture. The controller 1140 can include an embedded firmware and is adapted to manage and control the operation of the memory portion 1100'.

The memory device 1110 can also comprise other components, such as processor units coupled to the controller 1140, antennas, connection means (not shown) with the host device, and the like.

Multiple signal lines couple the memory controller 1140 with the memory portion 1100'. For example, such signal lines may include clock, command/address and write data (DQ), read DQ, and zero or more other signal lines. In general, the memory controller 1140 is operatively coupled to the memory portion 1100' via suitable buses.

The memory portion 1100' represents memory resources for system 1100. A memory cell may be a device or location for storing data. In one embodiment, the array 1120 of memory cells is managed as rows of data, accessed via wordline (rows) and bitline (individual bits within a row) control. In one embodiment, the array 1120 of memory cells includes a 3D crosspoint array such as the memory cell array 200 of FIG. 2. The array 1120 of memory cells can be organized as separate channels, ranks, and banks of memory. Channels are independent control paths to storage locations within memory portion. Ranks refer to common locations across multiple memory devices (e.g., same row addresses within different devices). Banks refer to arrays of memory locations within a memory device. In one embodiment, banks of memory are divided into sub-banks with at least a portion of shared circuitry (e.g., drivers, signal lines, control logic) for the sub-banks. It will be understood that channels, ranks, banks, or other organizations of the memory locations, and combinations of the organizations, can overlap physical resources. For example, the same physical memory locations can be accessed over a specific channel as a specific bank, which can also belong to a rank. Thus, the organization of memory resources will be understood in an inclusive, rather than exclusive, manner.

In one embodiment, memory controller 1140 includes refresh (REF) logic 1141. In one embodiment, refresh logic 1141 indicates a location for refresh, and a type of refresh to perform. Refresh logic 1141 can trigger self-refresh within memory, and issue external refreshes by sending refresh commands to trigger the execution of a refresh operation.

In one embodiment, access circuitry 1131 performs a refresh (e.g., reprogramming) of any of the accessed memory cells that were not refreshed by the double-polarity read sequence. Therefore, a complete refresh of memory cells can be achieved as mostly a side effect of the memory read sequence with minimal additional refresh operations.

In the embodiment illustrated in FIG. 11, the memory controller 1140 includes error correction circuitry. The error detection/correction circuitry 1142 can include hardware logic to implement an error correction code (ECC) to detect errors occurring in data read from memory portion. In one embodiment, error detection/correction circuitry 1142 also corrects errors (up to a certain error rate based on the implemented ECC code). However, in other embodiments, error detection/correction circuitry 1142 only detects but does not correct errors.

In the illustrated embodiment, the memory controller 1140 includes command (CMD) logic 1143, which represents logic or circuitry to generate commands to send to memory portion. The memory controller may also include a counter 1144, such as the counter disclosed above configured to count the number of bits switched during the read operation. Clearly, also other architecture can be employed, for example the counter can be embedded in the host 1150 or also in the circuit portion 1130.

Based on the received command and address information, access circuitry 1131 of the circuit portion 1130 performs operations to execute the commands, such as the read sequence of the present disclosure. In one such embodiment, the circuit portion 1130 includes sense circuitry 1132 to detect electrical responses of the one or more memory cells to the first voltage, the second voltage, and the third voltage. In one embodiment, the sense circuitry 1132 include sense amplifiers. FIG. 11 illustrates the access circuitry 1131 and sense circuitry 1132 as being embedded in the memory portion, however, other embodiments can include access circuitry and/or sense circuitry that is separate from the memory portion. For example, access circuitry and sense circuitry can be included in a memory controller such as the memory controller 1140.

In one embodiment, memory portion 1100' includes one or more registers 1133. The registers 1133 represent one or more storage devices or storage locations that provide configuration or settings for the operation of the memory portion. Furthermore, in one embodiment, the circuit portion 1130 includes also decode circuitry 1134.

The host device 11500 represents a computing device in accordance with any embodiment described herein, and can be a laptop computer, a desktop computer, a server, a gaming or entertainment control system, a scanner, copier, printer, routing or switching device, embedded computing device, or other electronic device such as a smartphone. The memory device may also be embedded in the host device.

In one embodiment, the system 1100 includes interface 1170 coupled to processor 1160, which can represent a higher speed interface or a high throughput interface for system components that needs higher bandwidth connections, or graphics interface components. Interface 1170 can represent a "north bridge" circuit, which can be a standalone component or integrated onto a processor die. Graphics interface interfaces to graphics components for providing a visual display to a user of system 1100. In one embodiment, graphics interface generates a display based on data stored in the memory device or based on operations executed by processor or both.

The system may also comprise network interface 1180 communicatively coupled to the memory device, and/or a battery coupled to provide power to said system.

In the preceding detailed description, reference is made to the accompanying drawings that form a part hereof, and in which is shown, by way of illustration, specific examples. In the drawings, like numerals describe substantially similar components throughout the several views. Other examples may be utilized, and structural, logical and/or electrical changes may be made without departing from the scope of the present disclosure. In addition, as will be appreciated, the proportion and the relative scale of the elements provided in the figures are intended to illustrate the embodiments of the present disclosure and should not be taken in a limiting sense.

As used herein, "a," "an," or "a number of" something can refer to one or more of such things. A "plurality" of something intends two or more. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

The invention claimed is:

1. A method for reading memory cells, comprising:
 applying a first voltage with a first polarity to a plurality of the memory cells;
 applying a second voltage with a second polarity to one or more of said plurality of the memory cells;
 applying at least a third voltage with the first polarity to one or more of said plurality of the memory cells, wherein the application of the second and third voltages is based on a triggering event;
 detecting electrical responses of memory cells to the first voltage, the second voltage, and the third voltage; and
 determining a logic state of respective memory cells based on the electrical responses of the memory cells to the first voltage, the second voltage, and the third voltage.

2. The method of claim 1, wherein the plurality of memory cells include one or more memory cells programmed to a first logic state with a voltage of the first polarity and one or more memory cells programmed to a second logic state with a voltage of a second polarity, wherein a magnitude of the first voltage is selected to be lower than an expected lowest threshold voltage magnitude exhibited by memory cells programmed to the second logic state when read with a voltage of the first polarity.

3. The method of claim 1, wherein a magnitude of the second voltage is selected to be lower than an expected highest threshold voltage magnitude exhibited by memory cells programmed to the second logic state when read with a voltage of the second polarity.

4. The method of claim 1, wherein a magnitude of the third voltage is selected to be higher than an expected highest threshold voltage magnitude exhibited by memory cells programmed to the first logic state when read with a voltage of the first polarity.

5. The method of claim 1, further comprising:
 determining that a first portion of the plurality of the memory cells is in a first logic state based on a first electrical response to the first voltage.

6. The method of claim 5, further comprising:
 determining that a second portion of the plurality of the memory cells is in a second logic state based on a second electrical response to the second voltage.

7. The method of claim 6, further comprising:
 determining that a third portion of the plurality of the memory cells is in the first logic state based on a third electrical response to the third voltage, and a remaining portion except for the first portion, the second portion, and the third portion of the plurality of the memory cells is in the second logic state.

8. The method of claim 7, further comprising:
detecting a third current through one or more of the plurality of the memory cells in response to the third voltage, and wherein the third portion of the plurality of the memory cells is determined to be in the first logic state based on the detection that a magnitude of the third current is greater or equal to a third threshold.

9. The method of claim 6, wherein applying at least a third voltage with the first polarity to one or more of the plurality of the memory cells comprises:
applying at least the third voltage to a remaining portion except for the first portion and the second portion of the plurality of the memory cells.

10. The method of claim 6, further comprising:
detecting a second current through one or more of the plurality of the memory cells in response to the second voltage, and wherein the second portion of the plurality of the memory cells is determined to be in the second logic state based on the detection that a magnitude of the second current is greater or equal to a second threshold.

11. The method of claim 5, wherein applying a second voltage with a second polarity to one or more of the plurality of the memory cells comprises:
applying the second voltage to a remaining portion except for the first portion of the plurality of the memory cells.

12. The method of claim 1, wherein detecting electrical responses of memory cells to the first voltage, the second voltage, and the third voltage further comprises:
detecting a threshold voltage for a given memory cell in response to an applied voltage, wherein the applied voltage is one of the first, second and third voltage;
wherein if the given memory cell is programmed with a same polarity as the applied voltage, a magnitude of the threshold voltage is detected to be in a first range; and
wherein if the given memory cell is programmed with a different polarity than the applied voltage, a magnitude of the threshold voltage is detected to be in a second range.

13. The method of claim 1, wherein:
the third voltage has a magnitude greater than that of the first voltage.

14. The method of claim 1, wherein the triggering event comprises a determination that the number of counted switched bites reaches a predetermined value.

15. A method, comprising:
applying a first voltage with a first polarity to a plurality of the memory cells;
applying a second voltage with a second polarity to one or more of said plurality of the memory cells;
applying at least a third voltage with the first polarity to one or more of said plurality of the memory cells;
detecting electrical responses of memory cells to the first voltage, the second voltage, and the third voltage;
determining that a first portion of the plurality of the memory cells is in a first logic state based on a first electrical response to the first voltage;
detecting a first current through the plurality of the memory cells in response to the first voltage, and wherein the first portion of the plurality of the memory cells is determined to be in the first logic state based on the detection that a magnitude of the first current is greater than or equal to a first threshold; and
determining a logic state of respective memory cells based on the electrical responses of the memory cells to the first voltage, the second voltage, and the third voltage.

16. A method, comprising:
applying a first voltage with a first polarity to a plurality of the memory cells;
applying a second voltage with a second polarity to one or more of said plurality of the memory cells;
applying at least a third voltage with the first polarity to one or more of said plurality of the memory cells;
detecting electrical responses of memory cells to the first voltage, the second voltage, and the third voltage, wherein detecting electrical responses of memory cells to the first voltage, the second voltage, and the third voltage further comprises:
detecting a threshold voltage for a given memory cell in response to an applied voltage, wherein the applied voltage is one of the first, second and third voltage;
wherein if the given memory cell is programmed with a same polarity as the applied voltage, a magnitude of the threshold voltage is detected to be in a first range; and
wherein if the given memory cell is programmed with a different polarity than the applied voltage, a magnitude of the threshold voltage is detected to be in a second range, wherein an upper end of the first range overlaps a lower end of the second range; and
determining a logic state of respective memory cells based on the electrical responses of the memory cells to the first voltage, the second voltage, and the third voltage.

17. A circuit for reading memory cells, comprising:
an access circuitry to:
applying a first voltage with a first polarity to a plurality of the memory cells;
applying a second voltage with a second polarity to one or more of the plurality of the memory cells; and
applying at least a third voltage with the first polarity to one or more of the plurality of the memory cells; and
a sense circuitry to detect electrical responses of memory cells to the first voltage, the second voltage, and the third voltage; and
wherein, the access circuitry is to determine a logic state of respective memory cells based on the electrical responses of memory cells to the first voltage, the second voltage, and the third voltage, and wherein the access circuitry is to determine that a first portion of the plurality of the memory cells is in a first logic state based on a first electrical response to the first voltage.

18. The circuit of claim 17, wherein the plurality of memory cells include one or more memory cells programmed to a first logic state with a voltage of the first polarity and one or more memory cells programmed to a second logic state with a voltage of a second polarity, wherein a magnitude of the first voltage is selected to be lower than an expected lowest threshold voltage magnitude exhibited by memory cells programmed to the second logic state when read with a voltage of the first polarity.

19. The circuit of claim 17, wherein a magnitude of the second voltage is selected to be lower than an expected highest threshold voltage magnitude exhibited by memory cells programmed to the second logic state when read with a voltage of the second polarity.

20. The circuit of claim 17, wherein a magnitude of the third voltage is selected to be higher than an expected highest threshold voltage magnitude exhibited by memory cells programmed to the first logic state when read with a voltage of the first polarity.

21. The circuit of claim 17, wherein:
the access circuitry is to determine that a third portion of the plurality of the memory cells is in the first logic state based on a third electrical response to the third voltage, and a remaining portion except for the first portion, the second portion, and the third portion of the plurality of the memory cells is in the second logic state.

22. The circuit of claim 21, wherein:
the sense circuitry is to detect a third current through the plurality of the memory cells in response to the third voltage, and wherein the third portion of the plurality of the memory cells is determined to be in the first logic state based on the detection that a magnitude of the third current is greater or equal to a second threshold.

23. The circuit of claim 22, wherein:
the access circuitry is to apply at least the third voltage to a remaining portion except for the first portion and the second portion of the plurality of the memory cells.

24. The circuit of claim 21, wherein:
the sense circuitry is to detect a second current through the plurality of the memory cells in response to the second voltage, and wherein the second portion of the plurality of the memory cells is determined to be in the second logic state based on the detection that a magnitude of the second current is greater or equal to a second threshold.

25. The circuit of claim 17, wherein:
the access circuitry is to determine that a second portion of the plurality of the memory cells is in a second logic state based on a second electrical response to the second voltage.

26. The circuit of claim 17, wherein:
the access circuitry is to apply the second voltage to a remaining portion except for the first portion of the plurality of the memory cells.

27. The circuit of claim 17, wherein:
the sense circuitry is to detect a first current through the plurality of the memory cells in response to the first voltage, and wherein the first portion of the plurality of the memory cells is determined to be in the first logic state based on the detection that a magnitude of the first current is greater than or equal to a first threshold.

28. A system for reading memory cells comprising:
a memory comprising a plurality of memory cells; and
a circuit communicatively coupled with the plurality of memory cells, the circuit comprising:
an access circuitry to:
apply a first voltage with a first polarity to a plurality of the memory cells;
apply a second voltage with the second polarity to one or more of the plurality of the memory cells; and
apply at least a third voltage with the first polarity to one or more of the plurality of the memory cells;
sense circuitry to detect electrical responses of memory cells to the first voltage, the second voltage, and the third voltage;
wherein, the access circuitry is to determine a logic state of respective memory cells based on the electrical responses of memory cells to the first voltage, the second voltage, and the third voltage, and wherein the access circuitry is to determine that a first portion of the plurality of the memory cells is in a first logic state based on a first electrical response to the first voltage.

29. The system of claim 28, wherein the plurality of memory cells include one or more memory cells programmed to a first logic state with a voltage of the first polarity and one or more memory cells programmed to a second logic state with a voltage of a second polarity, wherein a magnitude of the first voltage is selected to be lower than an expected lowest threshold voltage magnitude exhibited by memory cells programmed to the second logic state when read with a voltage of the first polarity.

30. The system of claim 28, wherein a magnitude of the second voltage is selected to be lower than an expected highest threshold voltage magnitude exhibited by memory cells programmed to the second logic state when read with a voltage of the second polarity.

31. The system of claim 28 wherein a magnitude of the third voltage is selected to be higher than an expected highest threshold voltage magnitude exhibited by memory cells programmed to the first logic state when read with a voltage of the first polarity.

32. The system of claim 28, further comprising any of a display communicatively coupled to the memory, a network interface communicatively coupled to the memory, or a battery coupled to provide power to the system.

* * * * *